(12) United States Patent
Poostchi

(10) Patent No.: US 11,790,125 B2
(45) Date of Patent: Oct. 17, 2023

(54) SYSTEM AND METHOD FOR AUTOMATED PRODUCTION OF BUILDINGS AND BUILDING COMPONENTS

(71) Applicant: Peyman Poostchi, Vancouver (CA)

(72) Inventor: Peyman Poostchi, Vancouver (CA)

(*) Notice: Subject to any disclaimer, the term of this patent is extended or adjusted under 35 U.S.C. 154(b) by 0 days.

(21) Appl. No.: 17/370,741

(22) Filed: Jul. 8, 2021

(65) Prior Publication Data

US 2022/0156424 A1 May 19, 2022

Related U.S. Application Data

(60) Provisional application No. 63/049,684, filed on Jul. 9, 2020.

(51) Int. Cl.
*G06F 30/13* (2020.01)
*G05B 19/418* (2006.01)
*E04B 1/348* (2006.01)

(52) U.S. Cl.
CPC ......... *G06F 30/13* (2020.01); *G05B 19/4188* (2013.01); *G05B 19/41805* (2013.01); *G05B 19/41865* (2013.01); *G05B 19/41885* (2013.01); *E04B 1/34861* (2013.01)

(58) Field of Classification Search
CPC ... G06F 30/00; G06F 30/13; G05B 19/41805; G05B 19/41865; G05B 19/4188; G05B 19/41885; E04B 1/34861
USPC .......................................................... 703/1
See application file for complete search history.

(56) References Cited

U.S. PATENT DOCUMENTS

| | | |
|---|---|---|
| 6,000,192 A | 12/1999 | Cohen |
| 7,153,454 B2 | 12/2006 | Khoshnevis |
| 7,292,908 B2 | 11/2007 | Borne |
| 7,641,461 B2 | 1/2010 | Khoshnevis |
| 8,185,240 B2 | 5/2012 | Williams |
| 8,240,108 B2 | 8/2012 | Pyo |

(Continued)

FOREIGN PATENT DOCUMENTS

WO  2010025204  3/2010

OTHER PUBLICATIONS

Vincenzo, Vincenzo De et al., "Industry 4.0—Implementation of an Automated Assembly Line in a Wooden Modular House Production Plant: The Case Leko Labs", Jun. 4-5, 2018, 2nd Robotix-Academy Conference for Industrial Robotics (RACIR), Core. (Year: 2018).*

*Primary Examiner* — Cedric Johnson
(74) *Attorney, Agent, or Firm* — JAFARI LAW GROUP, INC.

(57) ABSTRACT

An automated manufacturing system and method is provided. The system includes a software system and a production system. The software system includes a design module, an engineering module, and a manufacturing module for the design, engineering, and subsequent production of a prefabricated building product. The production system includes a matrix of cells and a plurality of robotic production units configurable with a plurality of production tools. The matrix includes a number of columns and a number of rows, each column representing a product to be worked on and each row representing a type of work to be performed on each product. The system processes a building model and configures each cell to perform specific work with one or more robotic production units and one or more production tools. A prefabricated building product is built in stages as it moves from cell to cell.

20 Claims, 21 Drawing Sheets

(56) References Cited

U.S. PATENT DOCUMENTS

| | | | |
|---|---|---|---|
| 8,621,818 B1 | 1/2014 | Glenn | |
| 9,151,046 B1 | 10/2015 | Francavilla | |
| 9,587,395 B2 | 3/2017 | Gilgan et al. | |
| 10,697,188 B2* | 6/2020 | Telleria | B05D 3/0413 |
| 2007/0262040 A1 | 11/2007 | Mifsud | |
| 2015/0190926 A1* | 7/2015 | Miegel | G06F 30/00 700/248 |
| 2016/0001461 A1 | 1/2016 | Gardiner et al. | |
| 2018/0029227 A1 | 2/2018 | Linnell et al. | |
| 2019/0251210 A1* | 8/2019 | Pivac | B28D 1/003 |
| 2020/0256051 A1 | 8/2020 | Becerril Hernandez | |

\* cited by examiner

Building Information Model:
P = A + B + C + D + E + F + G + H + I + J + K

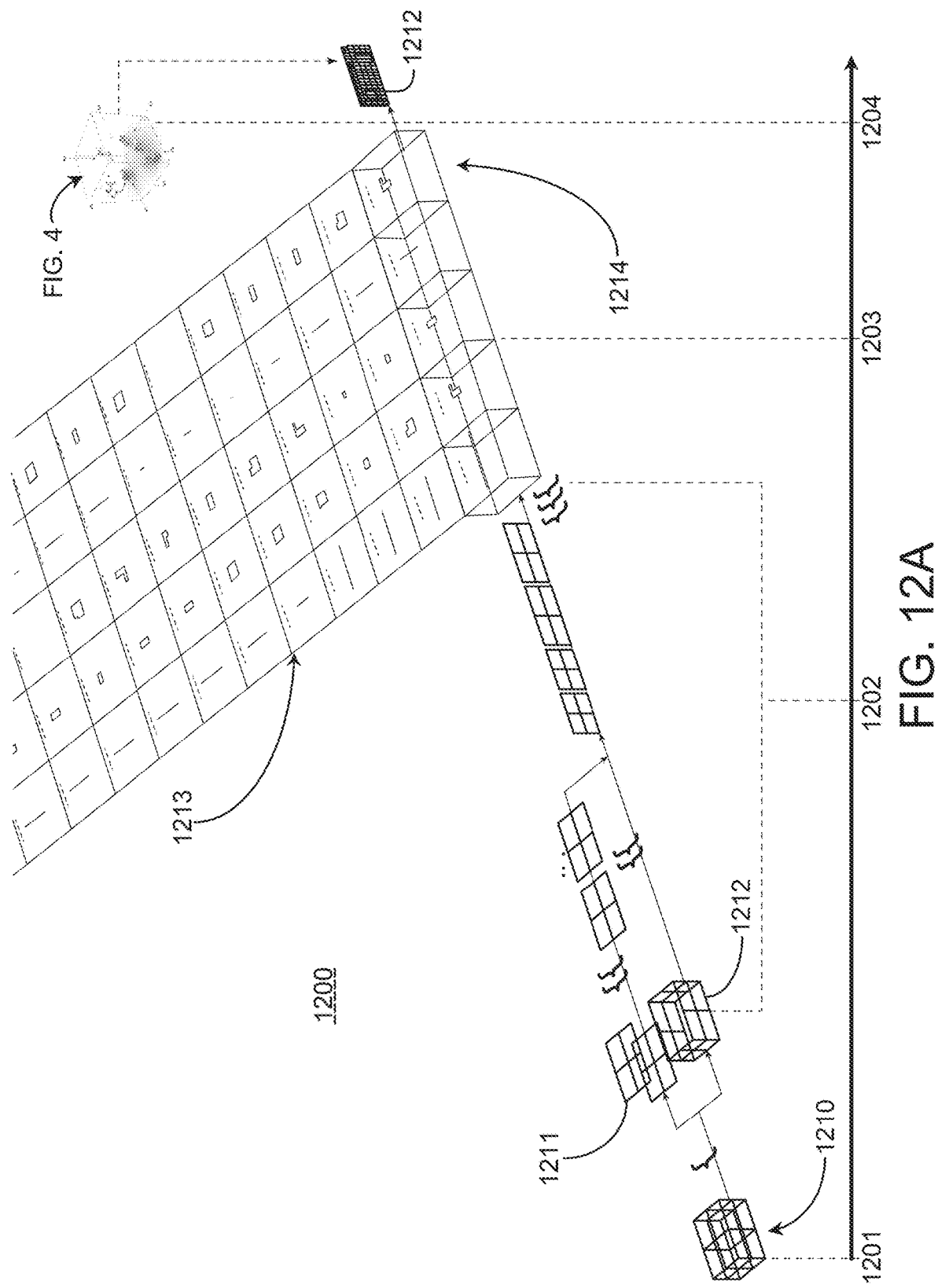

FIG. 12C

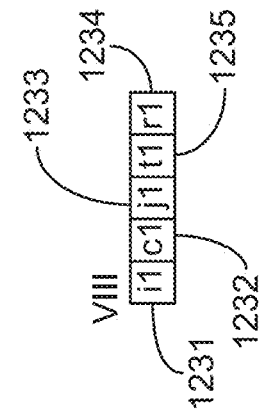
j1: sorting
j2: Assembling
j3: Fabricating...
t1: Handling
t2: Nailing
t3: Taping
t4: Cutting...
FIG. 12E
FIG. 12D
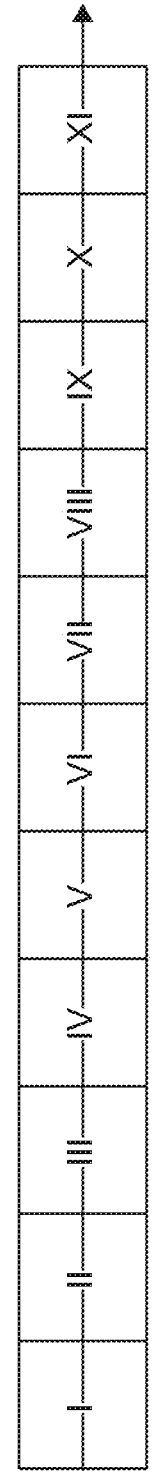
FIG. 12F

SYSTEM AND METHOD FOR AUTOMATED PRODUCTION OF BUILDINGS AND BUILDING COMPONENTS

PRIORITY NOTICE

The present application claims priority to U.S. Provisional Patent Application with Ser. No. 63/049,684, filed on Jul. 9, 2020, the disclosure of which is incorporated herein by reference in its entirety.

FIELD OF THE INVENTION

This invention relates to a framework, system, and method for mass customizable production of prefabricated building structures, including an automated and configurable production system for prefabricated buildings or prefabricated building components.

BACKGROUND

This section starts with an overview of current needs and challenges in the building industry regarding the workforce needed, construction productivity and safety, as well as building waste. It will continue with several examples of projects that have employed off-site manufacturing technologies and advanced wood material systems to address those challenges. Specifically, a lack of computational design tools and verified modes of automated construction for architects are discussed.

Nearly 1.7 million households in Canada need housing that meets the standards of eitheradequacy, affordability, or sustainability (Statistics Canada, 2017). In delivering these needs, the building industry faces production challenges. A labor force larger than eighty thousand workers is expected to be required by 2028 to keep pace with the demand and to replace retirees in the building industry (Build Force Canada, 2019). The shortage in workforce availability contributes to an ever-increasing cost of labor, thereby playing a significant role in the economics of construction projects. Ecologically, material debris and carbon footprint of conventional cement-based construction mandate significant improvements in ways of producing buildings. Construction is also reported as the deadliest workplace across Canada, with 217 fatalities and more than twenty-five thousand lost-time claims in 2017 alone (AWCBC, 2019). The building industry can benefit from the implementation of fully automated manufacturing and technology adoption to address the above-mentioned concerns.

Factory-built housing, such as prefab, modular, panelized, precast, etc., and mass customization approaches integrate and enhance the design and production process of buildings. This is mainly because of the flexible adoption of automation technologies, utilization of computer software, and process optimization in terms of material use and workforce in a manufacturing atmosphere.

Historically, the prefabricated kit houses became of interest in the first half of the $20^{th}$ century in North America, where more than 2000 homes, on average, were sold yearly through mail order from 1908 to 1940 (Sear Homes, 2012). Another example includes the prefabricated houses using steel frames that were a response to the shortage of homes after World War II in the United States (Lukas, 2001). The Future Home project in Spain (1998) implemented integrated approaches for producing modular building components. This was done using planned robotic erection, off-site prefabrication, and on-site automated assembly of the prefabricated parts (Balaguer, 2003).

Several successful attempts in the past decade have demonstrated the applicability of robotics and wood materials in automating and streamlining the construction supply chain. Composite woods, such as Cross Laminated Timber (CLT), have become a primary building material because of mechanical strength, ease of processing, and environmental benefits.

Manufactured housing, robotic technologies, and wood material have played an increasingly larger role to address fragmentation issues in current manually driven construction processes. However, the building industry has not yet fully benefited from the potential opportunities that computational technologies and ecofriendly material systems can unlock.

First, architects and engineers need a coherent approach and design tools in using such material systems and production methods to visualize, verify, and validate their customized designs before construction. Second, the complexity of technology implementation, ambiguity of production costs, and doubts about quality assurance make players in the AEC industry reluctant in utilizing such systems in their design and construction processes. Third, there is no successful solution for full automation of the fabrication of building parts. This is especially due to the challenge of integrating mechanical, electrical, and plumbing elements at the manufacturing level. As a result, existing solutions are limited to production of semi-assembled building parts (e.g., interior walls) that need to be manually assembled onsite.

There are a number of software platforms in the Architecture, Engineering, and Construction (AEC) industry. These range from tools for the design of geometrical objects to the engineering analyses and construction management of a project. However, a gap remains in the software implementation of automated off-site production processes. Building Information Modeling (BIM) tools contain a building asset's geometry, material, and lifecycle information, and these tools may provide the digital information needed to plan and fabricate building parts through automation. However, there is a need for computational tools and flexible methods to effectively and efficiently communicate and integrate the conceptual design phases of digital models to the production processes of manufacturing settings.

Accordingly, there is a need for an automated manufacturing system that accounts for the problems with existing manufacturing systems.

SUMMARY

According to some aspects of the present invention, a mass customizable production system for prefabricating buildings or building components is provided. In some exemplary embodiments, such system may include one or more production cells, each production cell configurable with one or more robotic units adapted to use one or more tools to form at least a component associated with a product for a prefabricated building or building component. The system may also include a software system in communication with the one or more robotic units used by the one or more production cells. The software system may be adapted to: generate a production matrix including parametric data of one or more components required to build the product based at least in part on an information model associated with the product; sort the one or more production cells in a sequence suitable for building the product based at least in part on the production matrix, including assigning to the one or more production cells work to be performed to form the one or more components, and one or more tools to perform the work; and control the one or more robotic units based at least in part on the parametric data of the one or more components to build the product.

In some exemplary embodiments, the software system is further adapted to reconfiguring at least one of the one or more production cells, by assigning to the at least one of the one or more production cells a new work to perform on a different component of the product or on a component of a new product, using the one or more tools or a new tool to perform the new work.

According to one aspect, one or more embodiments are provided below for an automated system comprising a plurality of production cells, a first track extending to a first production cell within the plurality of production cells and a second track extending to a second production cell within the plurality of production cells, a first robotic production unit adapted to move along the first track to the first production cell, a second robotic production unit adapted to move along the second track to the second production cell, a first tool configurable with the first robotic production unit and adapted to perform first work within the first production cell, a second tool configurable with the second robotic production unit and adapted to perform second work within the second production cell, and a software system configured to control the movement of the first production unit to the first production cell and the movement of the second production unit to the second production cell, to control the first tool to perform the first work within the first production cell, and to control the second tool to perform the second work within the second production cell, wherein the first tool and the first work and the second tool and the second work are chosen based at least in part on an information model processed by the software system. In some embodiments, generating the production matrix includes decomposing the information model associated with the product into the parametric data of the one or more components required to build the product.

In some embodiments, generating the production matrix includes decomposing the information model associated with the product to extract the parametric data of the one or more components required to build the product.

In some embodiments, the software system is further configured to receive user input concerning parametric data of the one or more components. In some embodiments, the software system is further configured to generate the information model.

In some exemplary embodiments, the parametric data of the one or more components include at least one or more of: a material of a component or a material of a component of a component; a geometry of the component or a geometry of the component of the component; and a reference point of the component or a reference point of the component of the component.

In some embodiments, the sequence of production cells suitable for building the product comprises of a group of production cells that are selected out of sequence or a group of production cells that are selected in sequential order.

In some embodiments, the software system includes a design module, an engineering module, and a manufacturing module adapted to process the information model.

In some embodiments, the software system is further configured to generate the information model.

In some embodiments, the system includes a design module, an engineering module, and a manufacturing module adapted to process the information model.

In some embodiments, the system is configured to control a first delivery of first raw materials to the first production cell and a second delivery of second raw materials to the second production cell.

In some embodiments, the first track and the second track are configured above the plurality of production cells and the first robotic production unit is suspended from the first track and the second robotic production unit is suspended from the second track.

In some embodiments, the first work and/or second work include at least one of sorting, processing, assembling, and painting.

In some embodiments, the first tool and/or the second tool include tools pertaining to at least one of material handling, milling, cutting, fastening, and spraying.

In some embodiments, the first work and/or the second work are performed on a prefabricated building product including at least one of exterior walls, interior walls, floors, ceilings, structural components, casework kits, bathroom kits, vertical connections, and building accessories.

According to some aspects of the present invention, a method, performed by a mass customizable production system configured for prefabricating buildings or building components, is provided. In some exemplary embodiments, the method may include the steps of: receiving or generating an information model associated with a product for prefabricating a building or building component; generating a production matrix including parametric data of one or more components required to build the product based at least in part on the information model; sorting one or more production cells in a sequence suitable for building the product based at least in part on the production matrix, including selectively assigning to the one or more production cells work to be performed to form the one or more components, and one or more tools to perform the work, wherein each of the one or more production cells is configurable with one or more robotic units adapted to use the one or more tools; and controlling the one or more robotic units based at least in part on the parametric data of the one or more components to build the product.

According to another aspect, one or more embodiments are provided below for a method for automated manufacturing comprising providing a plurality of production cells, providing a first track extending to a first production cell within the plurality of production cells and a second track extending to a second production cell within the plurality of production cells, suspending a first robotic production unit from the first track and a second robotic production unit from the second track, by one or more computer systems, processing an information model, by the one or more computer systems and based at least in part on the information model, determining first work to be performed within the first production cell and second work to be performed within the second production cell, by the one or more computer systems, determining a first tool to configure with the first robotic production unit to perform the first work, and a second tool to configure with the second robotic production unit to perform the second work, by the one or more computer systems, controlling the first robotic production unit to move to the first production cell and the second robotic production unit to move to the second production cell, configuring the first robotic production unit with the first tool and the second robotic production unit with the second tool, by the one or more computer systems, controlling the first robotic production unit to perform the first work, and by the one or more computer systems, controlling the second robotic production unit to perform the second work.

In some exemplary embodiments, the method may further include reconfiguring at least one of the one or more production cells, by assigning to the at least one of the one or more production cells a new work to perform on a different component of the product or on a component of a new product, using the one or more tools or a new tool to perform the new work.

In some exemplary embodiments, generating the production matrix includes decomposing the information model associated with the product to extract the parametric data of the one or more components required to build the product.

In some exemplary embodiments, the method further includes receiving user input concerning the parametric data of the one or more components.

In some exemplary embodiments, the sequence of cells suitable for creating the product comprises of a group of production cells that are selected out of sequence or a group of production cells that are selected in sequential order.

In some exemplary embodiments, generating the information model is achieved at least in part by a design module.

In some exemplary embodiments, the step of assigning the work to be performed to form the product is achieved by a manufacturing module.

In some exemplary embodiments, the method further comprises determining first raw materials for the first work and second raw materials for the second work and delivering the first raw materials to the first production cell and the second raw materials to the second production cell.

In some exemplary embodiments, the one or more computer systems includes a design module, an engineering module, and a manufacturing module adapted to process the information model.

In some exemplary embodiments, the first track and the second track are provided above the plurality of production cells.

In some exemplary embodiments, the first work and/or the second work are performed on a prefabricated building product including at least one of exterior walls, interior walls, floors, ceilings, structural components, casework kits, bathroom kits, vertical connections, and building accessories.

In some exemplary embodiments, the method further comprises moving the prefabricated building product to the first production cell.

In some exemplary embodiments, the method further comprises moving the prefabricated building product from the first production cell to the second production cell.

In some exemplary embodiments, the first work and/or the second work include at least one of sorting, processing, assembling, and painting.

In some exemplary embodiments, the first tool and/or the second tool include tools pertaining to at least one of material handling, milling, cutting, fastening, and spraying.

BRIEF DESCRIPTION OF THE DRAWINGS

Other objects, features, and characteristics of the present invention as well as the methods of operation and functions of the related elements of structure, and the combination of parts and economies of manufacture, will become more apparent upon consideration of the following description and the appended claims with reference to the accompanying drawings, all of which form a part of this specification. None of the drawings are to scale unless specifically stated otherwise.

FIG. 12A shows a schematic flowchart of a method performed by a mass customizable production system in accordance with exemplary embodiments hereof;

FIG. 12C-FIG. 12E shows exemplary data structures that may be used by a software system in accordance with one exemplary embodiment of the present invention;

FIG. 12F shows a schematic representation of a production matrix in accordance with one exemplary embodiment of the present invention;

DETAILED DESCRIPTION OF EXEMPLARY EMBODIMENTS

As used herein, unless used otherwise, the following terms and abbreviations have the following meanings:

The term "item" will mean any physical product that may be formed or otherwise produced by the system.

The term "work to be performed" or simply "work" will mean any actions taken by the system during the production or forming of an item.

In general, the system according to exemplary embodiments hereof, provides a system and method for automated manufacturing. The automated manufacturing system provides a plurality of software tools, robotic manufacturing tools, and other tools as necessary to facilitate the design, engineering, and production of a wide variety of items.

Figure 1:
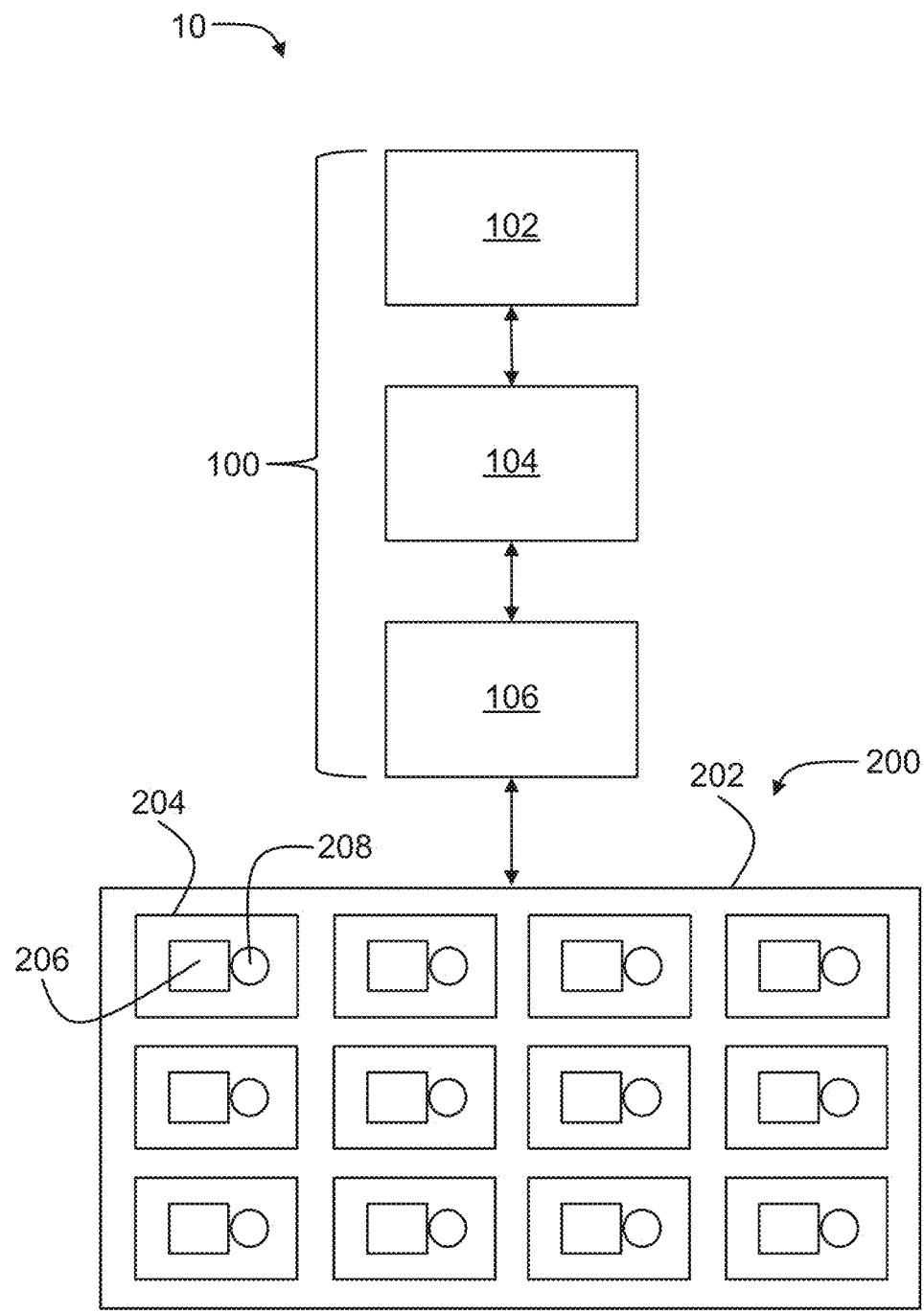
FIG. 1 shows an overview schematic of an automated manufacturing system in accordance with exemplary embodiments hereof.

In some embodiments as shown in FIG. 1, the system 10 includes a software system 100 and a production system 200. In general, the software system 100 provides the tools to facilitate the design and engineering of an item P, and to control the production system 200 for the subsequent manufacturing of the item P. The system 10 also may include other elements as required for the system 10 to perform its functionalities.

For the purposes of the specification, the system 10 will first be described in terms that may apply to the production of any item P. The specification then will provide a use case describing the use of the system 10 to produce prefabricated buildings or building components and the elements that comprise such buildings or building components. In some exemplary embodiments, the prefabricated building may be a prefabricated home and examples below may illustratively refer to a home, but a person of ordinary skill in the art will understand that other types of buildings and structures that may be prefabricated may be achieved with the present invention, including, without limitation any type of structure with a roof and walls, such as a house, school, store, or factory, or any type of residential structure or commercial structure or industrial structure or components to build the same. Moreover, it is understood that the system 10 may be applied to any industry to produce any type of item and that the scope of the system 10 is not limited in any way by the type(s) of item(s) that it may be configured to produce.

In some embodiments, the software system 100 includes a design module 102, an engineering module 104, and a manufacturing module 106. In addition, the production system 200 may include at least one production facility 202 including one or more production cells 204, each equipped with one or more robotic production units 206 each reconfigurably equipped with specific tooling 208. This will be described in detail in other sections.

In some embodiments, the design module 102 includes tools to generate, manage and/or otherwise implement building information models (BIMs) for the items P to be produced. The BIMs may be imported and/or acquired by measurement, assessment, and/or categorization of the items P. The BIMs may include digital representations of the physical form-related and/or functional characteristics of each item P including geometry- and material-related data. In this way, a user of the system 10 may utilize and interact with the BIMs (through use of the module 102) to visualize, simulate, design, generate, modify, customize, and ultimately provide geometric models of the items P to the engineering 104 and manufacturing modules 106 for the subsequent production of the items P.

In some embodiments, the engineering module 104 receives the production models for the items P from the design module 102 and analyzes the models to ensure adherence to predetermined engineering requirements (e.g., mechanical requirements, structural requirements, thermal/energy requirements, material requirements, functional requirements, etc.). In some cases, this may involve modifying the models accordingly, either automatically or thorough interaction with the user.

Once the models are deemed ready for production, the engineering module 104 may determine and/or optimize the robotic production unit(s) 206 and/or the tooling 208 necessary to produce the items P within a particular production cell 204. This may include equipping the production cell 204 and/or the robotic production unit(s) with sensors, such as, but not limited to, vision, image, position, and other types of sensors. This also may include simulating the kinematics of the tools 208 for use with a corresponding robotic production unit 206 within the production cells 204 as described below.

In some embodiments, the manufacturing module 106 receives information regarding the item models, the production cell(s) 204, the robotic production unit(s) 104, the tooling 106, and the materials, and digitally simulates the production process accordingly. The manufacturing module 106 may provide and/or calculate the required spatial dimensions of each production cell 204, collision detection of the robotic production unit(s), the raw material data (e.g., the cost, weight, size, shape, etc.) of each item P, and the running time of each specific production process. The manufacturing module 106 utilizes this data to verify the production process for each cell 102, to manage the acquisition and inventory levels of the raw materials, and to coordinate the completion and subsequent delivery of the finished items P. In this way, the manufacturing module 106 generally provides the users of the system 10 with the tools necessary to visualize and manage the overall production process.

Figure 2:
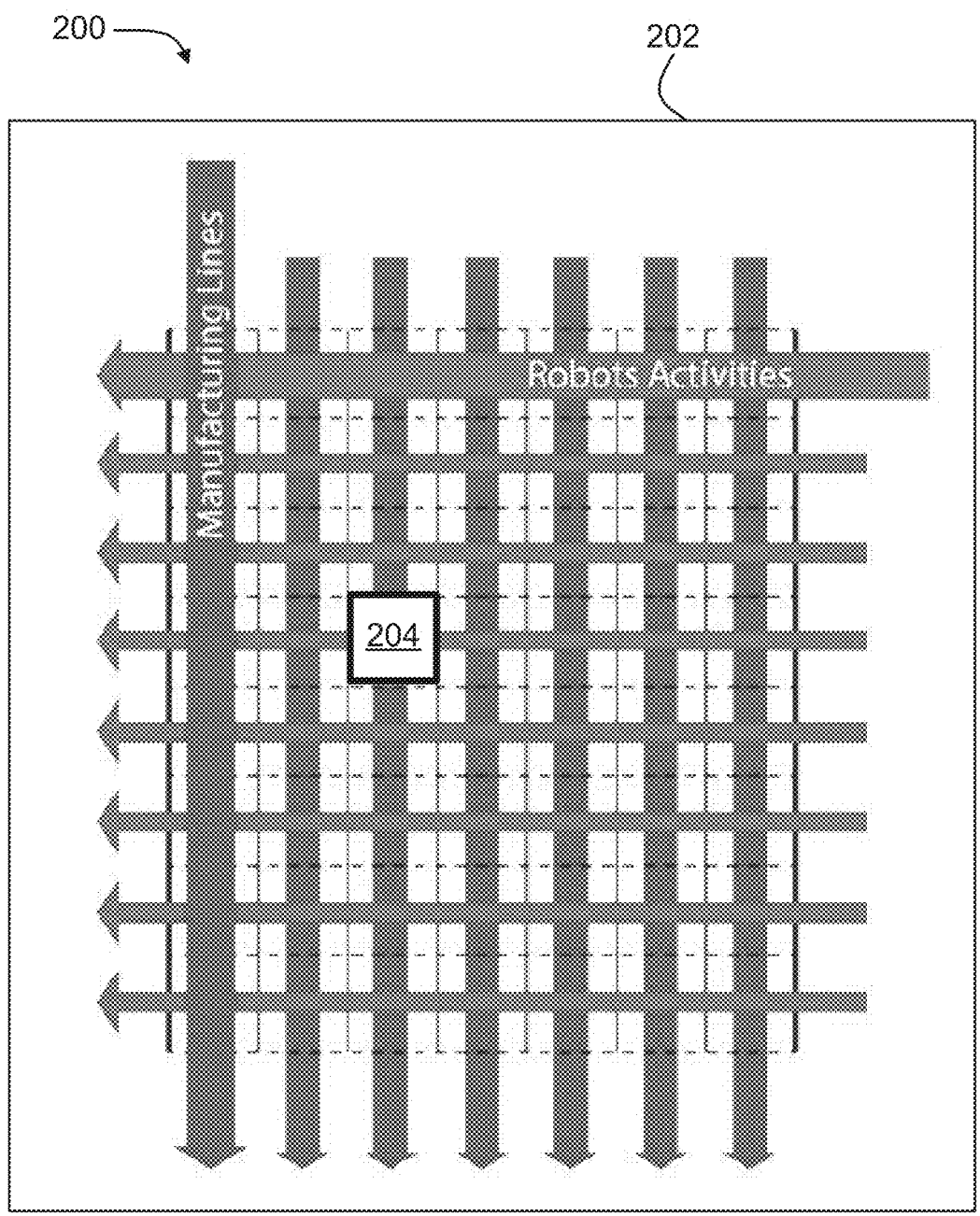
FIGS. 2-3 show exemplary schematics of a manufacturing facility in accordance with exemplary embodiments hereof.
Figure 3:
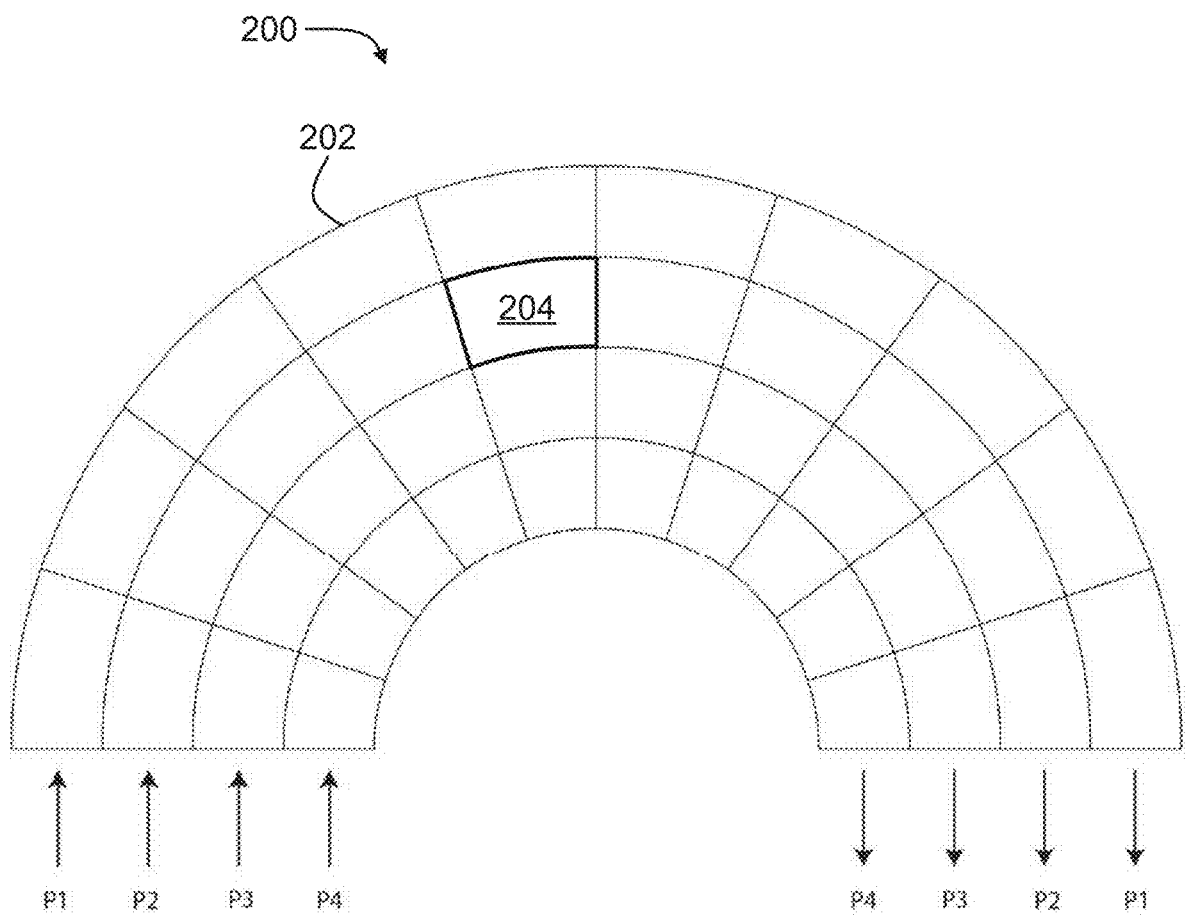

In some embodiments as shown in FIGS. 2-3, the manufacturing system 200 may be represented as a plurality of production cells 204 within the production facility 202, with each cell 204 customizable for the work to be performed within that cell 204. FIG. 2 shows a facility layout including a generally rectilinear matrix and FIG. 3 shows a facility layout including a semi-circular matrix (with each product P1-P4 passing through distinct concentric production paths). It is understood that the facility layout may include any suitably shaped matrix and that the scope of the system 10 is not limited in any way by the shape of the facility's layout.

In some embodiments, a production cell 204 may include at least one robotic production unit 206 (see FIG. 1). The cell 204, and the robotic production unit 206, may be product-neutral until assigned a specific item P to be worked on and the specific work to be performed on that item P. Accordingly, until the assignment is made, the robotic production unit 206 may not yet be equipped with the specific tooling 208 needed to perform a specific production task. As described above, the assignment may be made by the engineering module 104 in conjunction with a Building Information Model and other elements of the software system 100.

Figure 4:
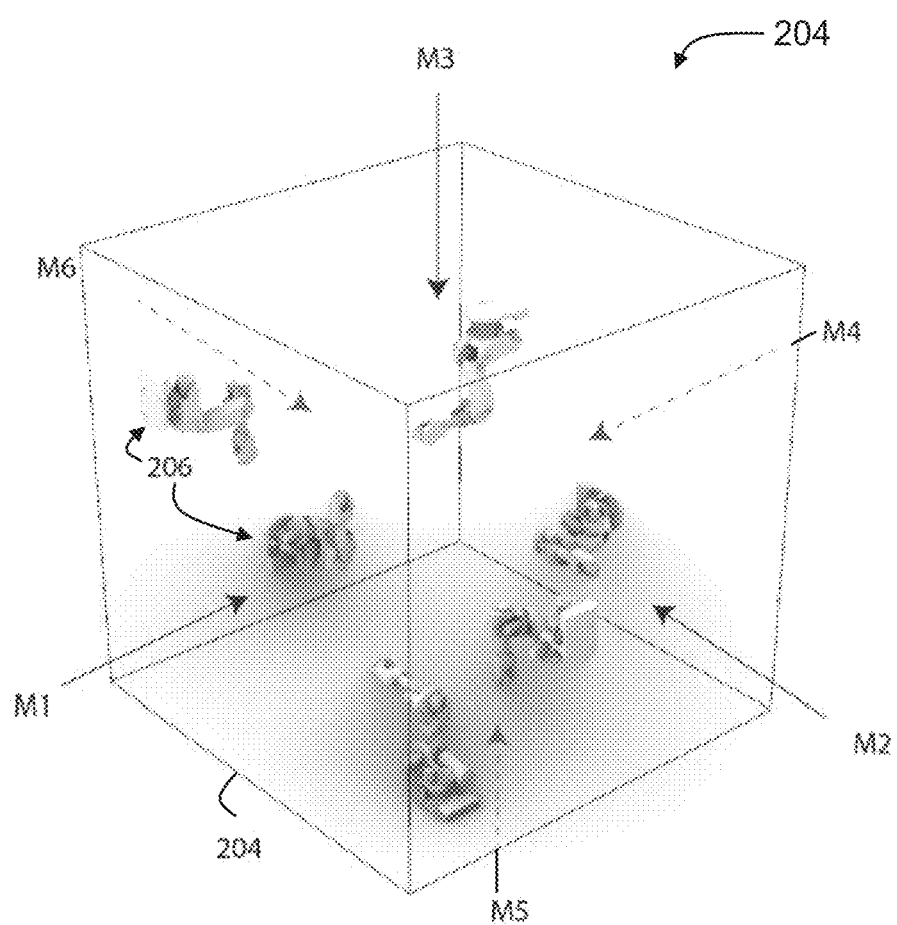
FIG. 4 shows aspects of a production cell in accordance with exemplary embodiments hereof.

Once the assignment is made, the robotic production unit 206 within the cell 204 may be equipped with the required tooling 208 (preferably in real time). As shown in FIG. 4, the system 10 also may provide the cell 204 with the raw materials M required to work on the item P. Moreover, raw materials M may be continually provided throughout and at each production cell during the entire production process for a particular item P. In some embodiments, the raw materials M may be provided to the cell 204 from any direction and/or orientation. For example, the system 10 may provide the raw materials M1 from the left, raw materials M2 from the front, raw materials M3 from the top, raw materials M4 from the right, raw materials M5 from the bottom, and raw materials M6 from the back. In some exemplary embodiments, to achieve providing raw materials to a production cell, a toolpath may be determined between a raw material source and the production cell to which the raw materials are assigned to using techniques such as, but not limited to, CAD to path techniques, which consider the spatial configuration of the target production cell and parametric data concerning the raw materials, such as size, shape, dimensions, etc.

Prior to, during, and/or in parallel with the providing of the raw materials M to a cell 204, the system 10 may control the robotic production unit(s) 206 to perform the work. As described above, these actions may be automated and controlled by the software system 100. Accordingly, it is seen that each production cell 102 is configured to perform particular work on a particular item P when the work is needed (preferably in real time). Given this, a production cell 204 that is configured and utilized to perform particular work on a particular item P1 at a first moment in time may be reconfigured (in real time) to perform different work on a different item P2 at a second moment in time. This is in contrast to rigid production lines that sit idle when the work within each line is completed.

Figure 5:
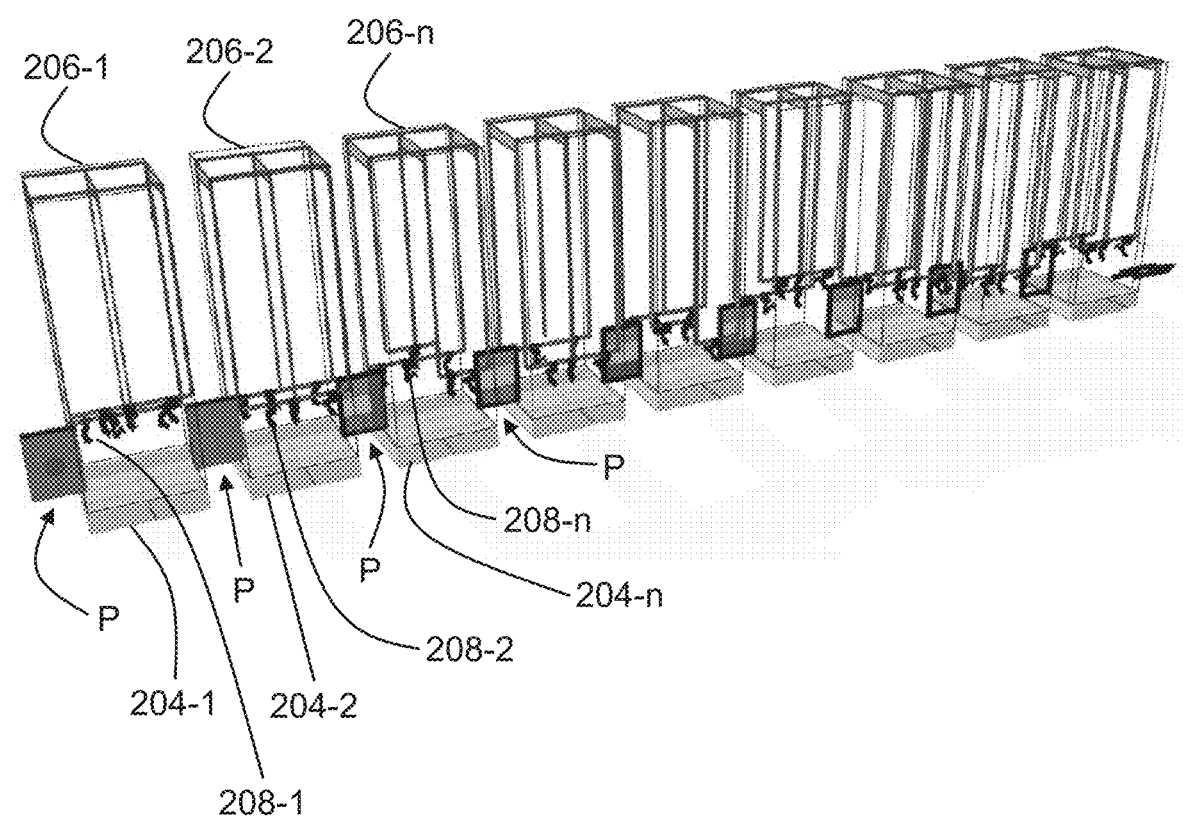
FIG. 5 shows a materials delivery schematic within an automated manufacturing system in accordance with exemplary embodiments hereof.

In some embodiments as shown in FIG. 5, the robotic production units 206 include n-axis robots, where n may equal any number. In some embodiments, the robotic production units 206 include 6-axis and/or 7-axis robots. The 6-axis robots may preferably be configured to move in the X, Y, and Z planes, as well as to position themselves using roll, pitch, and yaw movements. The 7-axis robots may preferably be configured to include an "elbow movement" which changes only the robot's elbow angle without affecting the position or posture of the tool.

In some embodiments, the robotic production units 206 are suspended from an upper portion (e.g., the ceiling) of the production facility 202. In this way, the units 206 may access the production cells 204 from above. The robotic units 206 are preferably configured with a track and hydraulic pull cylinders or other type of guidance system that enables the units 206 to travel to any necessary location within the production facility 202 in order to perform any work as required. In this way, each unit 206 may be programmed and controlled to interface with any production cell 204 without occupying the floorspace of the facility 202. It is preferable that the movements and the actions taken by the robotic production units 206 be managed, implemented, and generally controlled by the software system 100.

As shown in FIG. 5, an item P may receive first work at a first cell 204-1 from a first robotic production unit 206-1 using a first tool 208-1. The item P may then move to a second cell 204-2 to receive second work from a second robotic production unit 206-2 using a second tool 208-2. The process may continue with the item P moving to an nth cell 204-n to receive nth work from an nth robotic production unit 206-n using an nth tool 208-n. In this way, as the item P moves from cell 204 to cell 204, it may receive additional work until the item P is completed.

Figure 6:
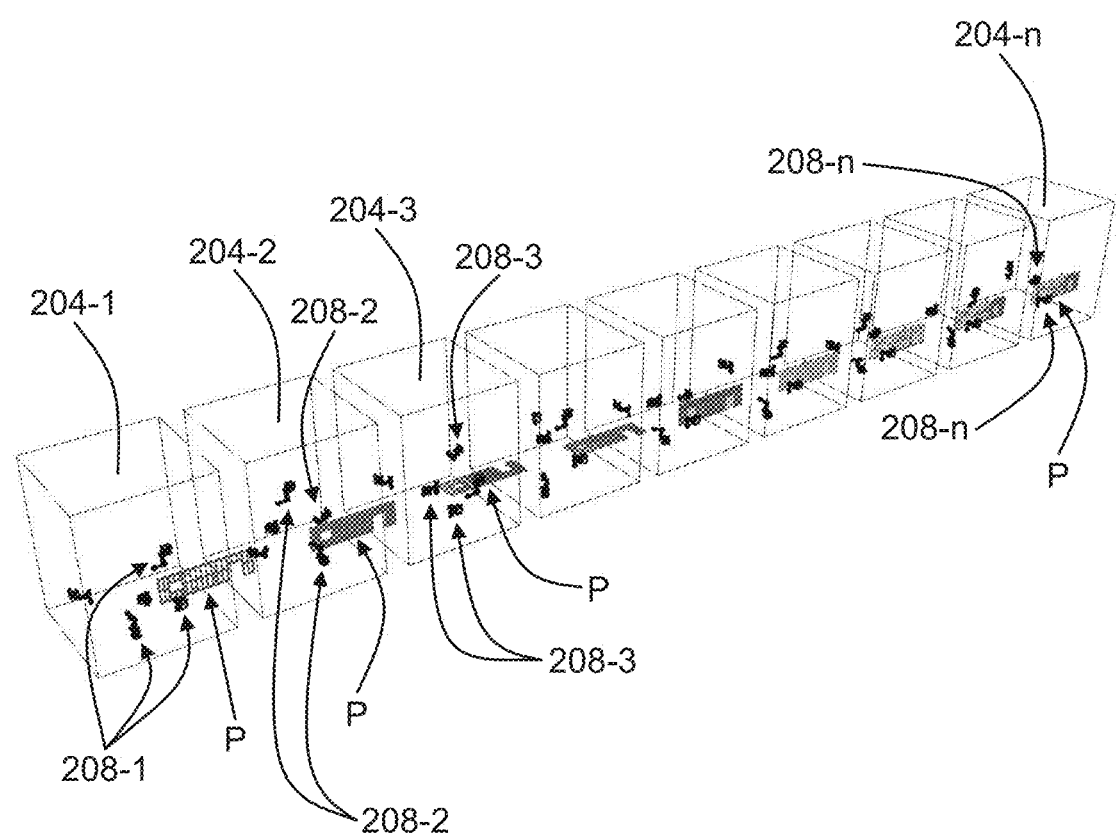
FIG. 6 shows a schematic of adjacent production cells within a manufacturing or mass customizable production facility in accordance with exemplary embodiments hereof.

FIG. 6 depicts another example of an item P moving from a first cell 204-1 to receive first work using one or more first tools 208-1, to a second cell 204-2 to receive work using a second tool 208-2, to a third cell 204-3 to receive work using a third tool 208-3, and to a nth cell 204-n to receive work using an nth tool 208-n. As shown, the tools 208-3 may approach the product P from any direction and/or orientation (e.g., from above, from one or more sides, from below, etc.).

As described above, in preparation for this process, each cell 204 may be assigned an item P, the work to be performed on the item P, and the necessary robotic production unit 206 and tooling 208 needed to perform the work. The system 10 may then provide these elements, along with the raw materials, to the cells 204 so that the work may be completed. At the completion of the work, the cells 204 may be reconfigured with different robotic production units 206 and different tooling 208 to perform different work on different items P (preferably in real time). In this way, each cell 204 may be immediately reconfigurable for new work thereby eliminating idle downtime and making the most use of an available production cell.

Figure 7:
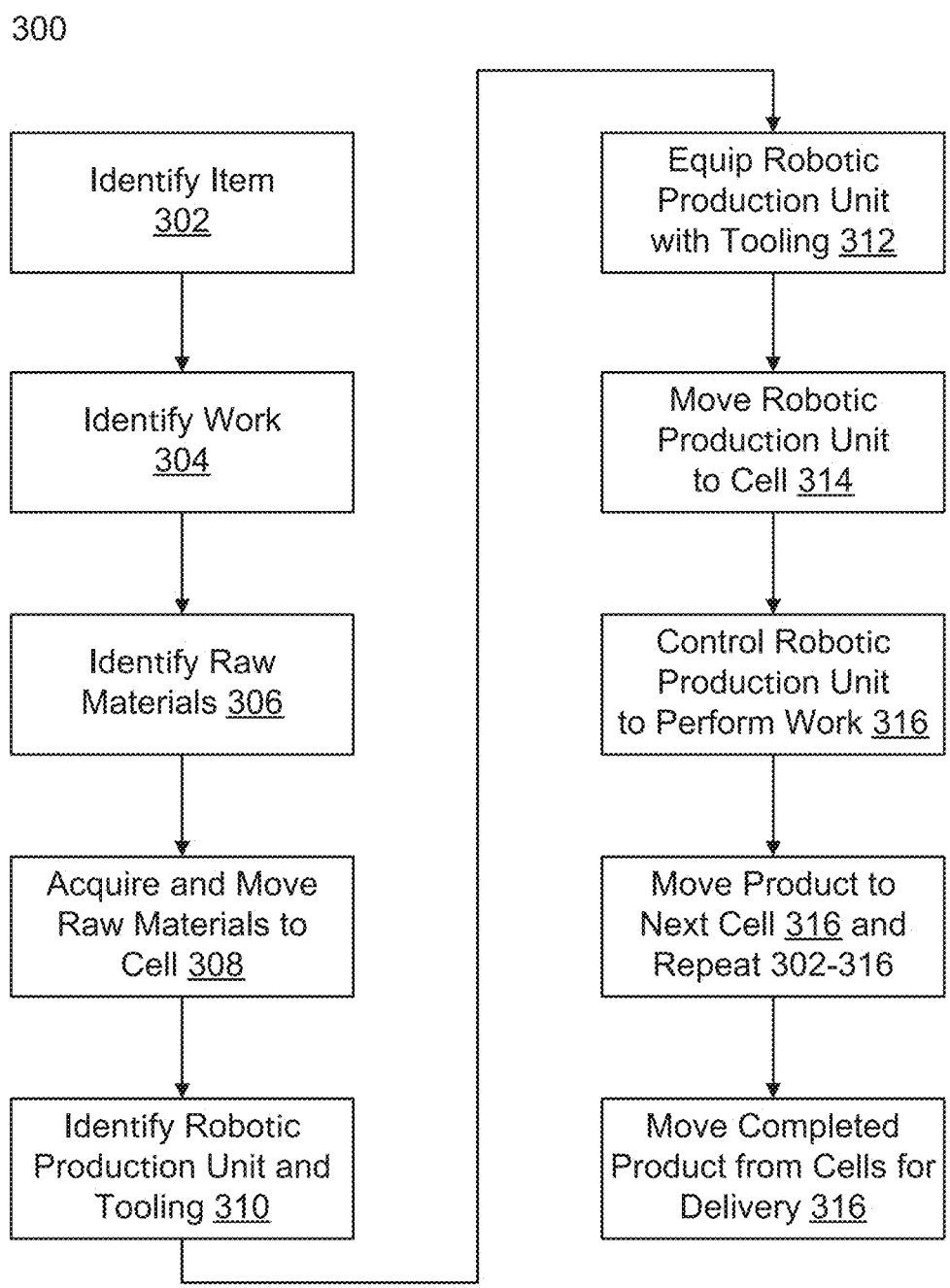
FIG. 7 shows example workflow actions taken by an automated mass customizable production system in accordance with exemplary embodiments hereof.

In some embodiments as shown in FIG. 7, once the design module 102, the engineering module 104, and the manufacturing module 106 have each completed their core competences, one or more of these software modules of the system 10 may perform the following actions 300 for each production cell 204:

302: Identify the item P to be worked on within the cell 204;
304: Identify the work to be performed (the robotic application) on the selected item P;
306: Identify the raw materials M needed;
308: Acquire and move the raw materials M to the cell 204;
310: Identify each robotic production unit 206 and the required tooling 208 needed to perform the work (for the robotic application(s));
312: Equip each robot production unit 206 with the required tooling 208;
314: Move the robotic production unit 206 to the cell (if not already there);
316: Control the robotic production unit 206 to perform the work;
318: Move the product P to a next cell 204 (or stay in the same cell) and repeat actions 302-316; and
320: Once completed, move the completed items P from the cell(s) 204 for delivery.

It is understood that the actions 300 described above are meant for demonstration and that other actions may be taken in addition to those listed. It also is understood that not all of the actions need be taken. It also is understood that the scope of the system 10 is not limited in any way by the actions described herein or otherwise that it may take while performing its functionalities.

Various embodiments and details of the system 10 will next be described by way of several detailed examples. The examples provided below are chosen to illustrate various embodiments and implementations of the system 10, and those of ordinary skill in the art will appreciate and understand, upon reading this description, that the examples are not limiting and that the system 10 may be used in different ways. It also is understood that details of different embodiments described in different examples may be combined in any way to form additional embodiments that are all within the scope of the system 10.

Use Case: Prefabricated Homes

Figure 8:
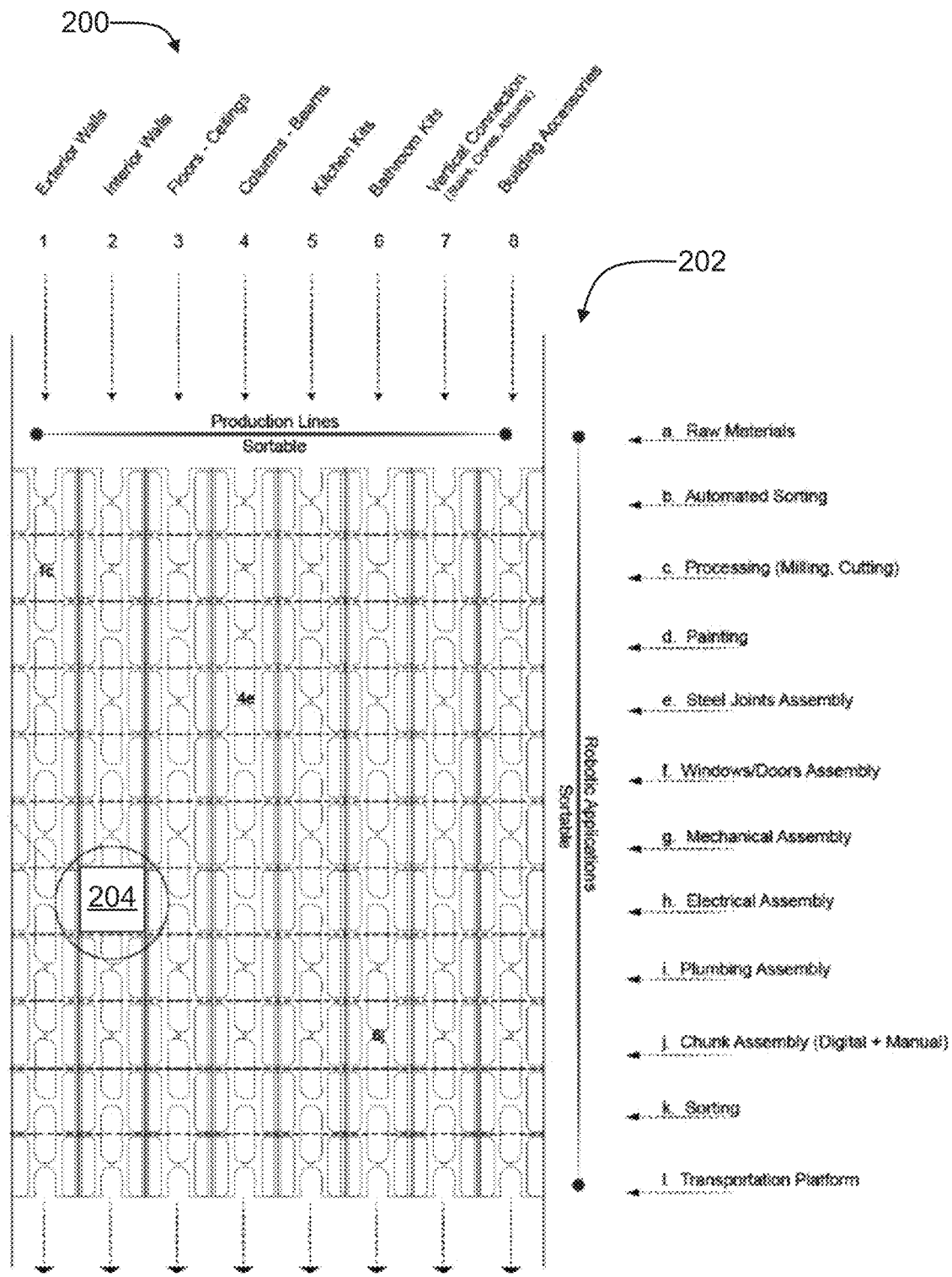
FIG. 8 shows aspects of a plurality of production cells in accordance with exemplary embodiments hereof.

FIG. 8 depicts an exemplary schematic of an automated manufacturing system 10 configured (preferably in real time) to produce prefabricated homes and the components that comprise such homes. As shown, the production facility 202 is represented as a plurality of production cells 204, with each cell 204 assigned an item P to work upon and the work to be performed. The items P to be worked upon (also referred to as the production lines) are listed in the column headings and may include (without limitation):

1. Exterior walls;
2. Interior walls;
3. Floors and ceilings;
4. Structural elements (e.g., columns, beams, framing, etc.);
5. Casework kits;
6. Bathroom kits;
7. Vertical connections (stairs, cores, atriums);

8. Building accessories; and
9. Other categories.

In addition, the geometry—and material-related data from the BIM models—also may be collected and/or created, either automatically or through interaction with the user, for the following loadable building elements: (i) mechanical, (ii) electrical, (iii) plumbing, (iv) steel reinforcements, (v) insulations, (vi) windows, (vii) doors, (viii) fixtures, (ix) rails, and others.

In some embodiments, the work (also referred to as the robotic applications) that may be applied to the items P are listed in the row headings and may include (without limitation):

1. Raw material acquisition;
2. Automated material flow;
3. Processing/fabrication (e.g., 3D printing, milling, cutting, thermoforming, fibrous composites, etc.);
4. Painting;
5. Steel joints assembly;
6. Windows and doors assembly;
7. Mechanical assembly;
8. Electrical assembly;
9. Plumbing assembly;
10. Chunk assembly (digital and manual);
11. Material flow;
12. Transportation platform; and
13. Other work.

Figure 9:
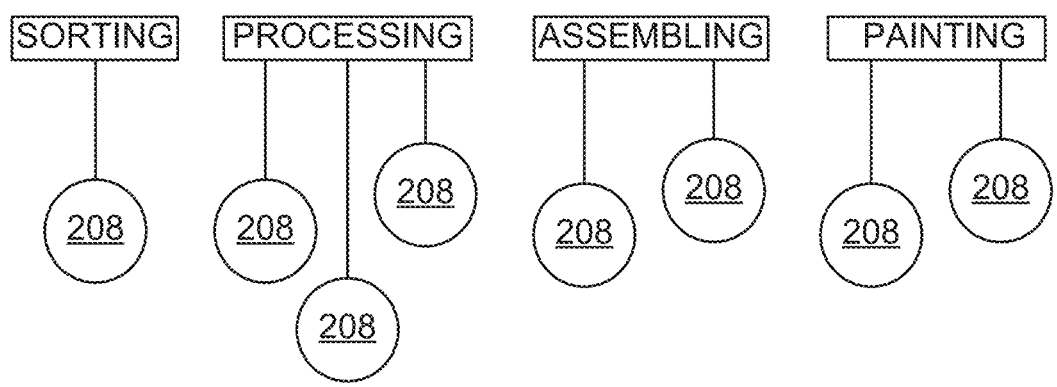
FIGS. 9-10 show aspects of manufacturing tools in accordance with exemplary embodiments hereof.

In some embodiments as shown in FIG. 9, the work to be performed on the above items P may be categorized into four main categories including (without limitation): (i) material flow, (ii) processing/fabricating, (iii) assembling, and (iv) painting, and the robotic production units 206 may be equipped with one or more of the following tooling 208 (without limitation): (i) material handling, (ii) milling, (iii) cutting, (iv) fastening, and (v) spraying. Note that the examples above generally pertain to wood-based items P, and that additional categories of work and additional associated tooling 208 may be provided depending on the materials used.

Table 1 below cross references example work to be performed and the respective necessary tooling 208 for an exemplary prefabricated home manufacturing system 10.

TABLE 1

| Work to be performed: | Robotic Head Tool(s) 208 Needed: |
| --- | --- |
| Material flow | Material handing |
| Processing/fabricating | Material handling |
|  | Milling |
|  | Cutting |
| Assembling | Material handling |
|  | Fastening |

Figure 10:
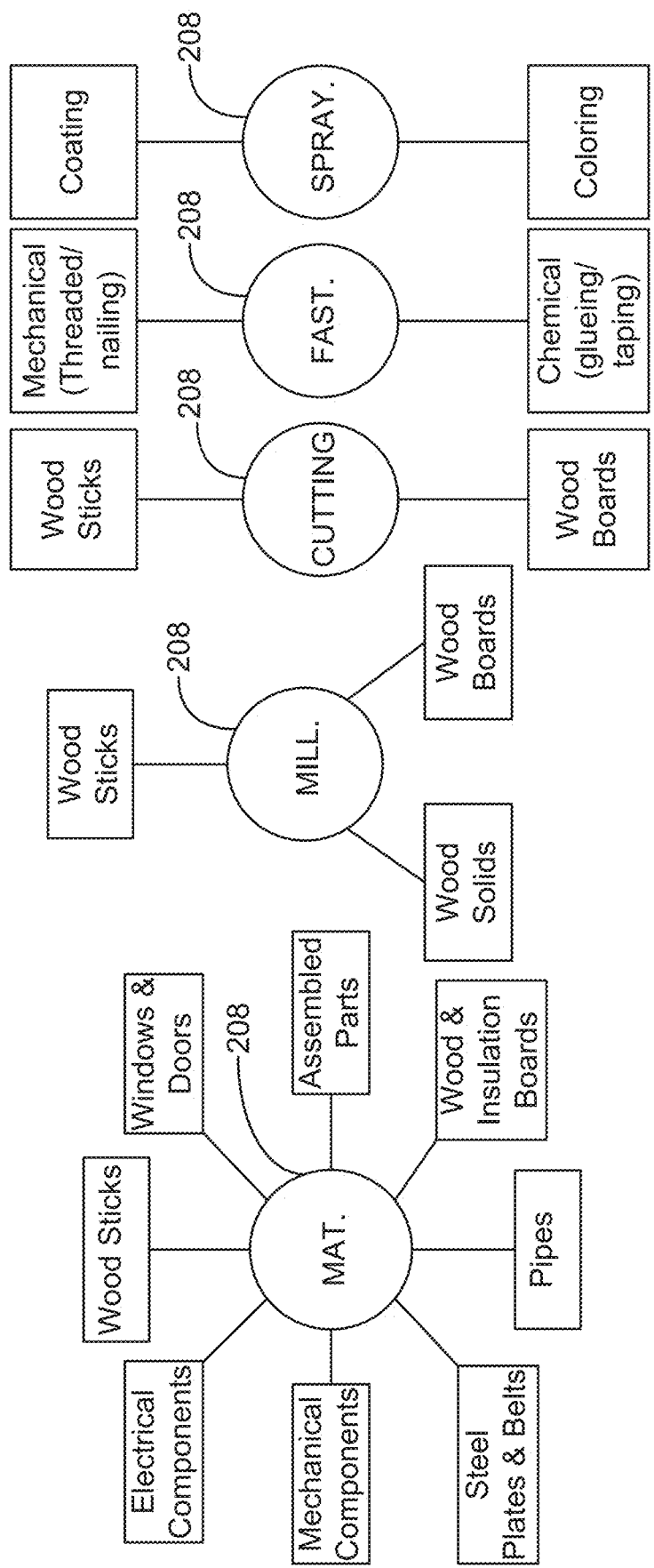

FIG. 10 depicts and Table 2 below cross references the robotic head tools 208 with the raw materials typically utilized during the respective work.

TABLE 2

| Robotic Head Tools 208: | Raw materials worked with: |
| --- | --- |
| Material handing | Wood sticks |
|  | Windows and doors |
|  | Assembled parts |
|  | Wood and insulation boards |
|  | Plumbing elements |
|  | Steel reinforcements |
|  | Mechanical elements |
|  | Electrical elements |

TABLE 2-continued

| Robotic Head Tools 208: | Raw materials worked with: |
| --- | --- |
| Milling | Wood sticks |
|  | Wood boards |
|  | Wood solids |
| Cutting | Wood sticks |
|  | Wood boards |
| Fastening | Mechanical - threaded and nailing |
|  | Chemical - gluing and taping |
| Spraying | Paint coating |
|  | Paint coloring |

Figure 11:
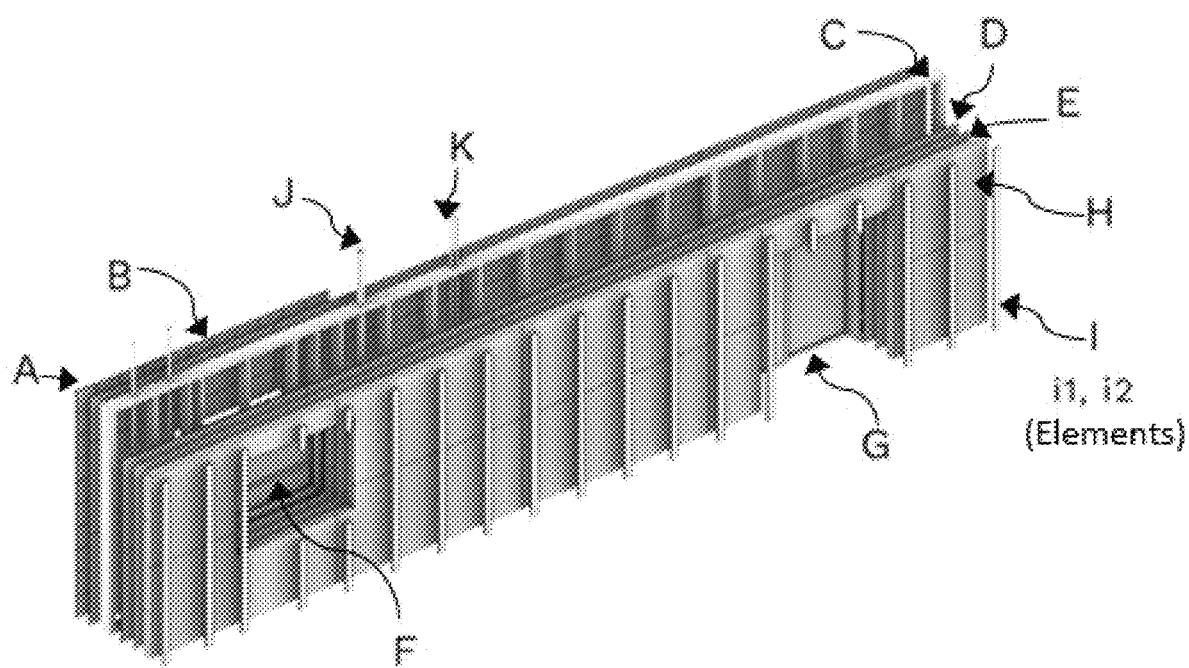
FIG. 11 shows a schematic representation of a Building Information Model (BIM) for an exemplary product in accordance with exemplary embodiments hereof.

FIG. 11 shows a schematic representation of a Building Information Model (BIM) for an exemplary product P including components A-K:

$$P = A+B+C+D+E+F+G+H+I+J+K$$

The different components may correspond to different components that may be required to build a product. For example, and without limiting the scope of the present invention, FIG. 11 may show a building or portion of a building product such as wall containing components and elements. In such a case, the product P is a wall 1100, which comprises of a variety of components A-K, including tiling A, drywalling B, framing C, sheathing D, air barrier E, window F, door G, rigid insulation H, strapping I, plumbing J, and electrical wiring K. Each component may have one or more elements, and depending on the complexity of elements, each element may have sub-elements. As will be explained further below, software system 100 may be configured to receive or generate an information model, for example a BIM that includes the design of each product P including the components and elements of product P. In exemplar embodiments, based on this BIM, and data that may be received concerning the materials that will be used to build product P, system 100 may be configured to generate a product matrix that includes parametric data on each of the elements and sub-elements, to use that information to control robotic units that will build the product P.

Examples of elements may include, without limitation or without deviating from the scope of the present invention, the following:

Tiling A may include elements such as a plurality of individual tiles $a_1 \ldots a_n$ that make up the tiling—these may be different types of tiles or similar tiles depending on the characteristics of the tiling A. In some exemplary embodiments, the type of tile including its size and material may be supplied to system 10 via user entry or data received by software system 100.

Drywalling B may include sub-elements such as a gypsum board $b_1 \ldots b_n$ that makes up the drywall—there may be additional sub elements or only a single sub element, depending on the characteristics of the drywall B. In some exemplary embodiments, the type of drywall including its size, shape, material, and other attributes may be supplied to system 10 via user entry or data received by software system 100.

Framing C may include elements such as studs $c_1$ and other sub elements such as nails, screws, plates, headers, rafters, girders, etc. $\ldots c_n$ that makes up the frame of the wall 1100. In some exemplary embodiments, the type of framing including elements and sub element sizes, shapes, materials, and other attributes may be supplied to system 10 via user entry or data received by software system 100.

Sheathing D, may include elements such as a plywood board $d_1$ and other sub elements $d_n$ that makes up the sheathing—there may be additional sub elements or only a single sub element, depending on the characteristics of the sheathing D, e.g. nails, glues, etc. In some exemplary embodiments, the type of sheathing including sub element sizes, shapes, materials, and other attributes may be supplied to system 10 via user entry or data received by software system 100.

Air barrier E may include elements such as a house wrap sheet $e_1$ and other sub elements $e_n$ that makes up the air barrier—there may be additional sub elements, e.g., tapes, or only a single sub element, depending on the characteristics of the air barrier E. In some exemplary embodiments, the type of air barrier including element and sub element, e.g., tape, sizes, shapes, materials, and other attributes may be supplied to system 10 via user entry or data received by software system 100.

Window F may include elements such as a window glass $f_1$ and other sub elements $f_n$ that makes up the window. In some exemplary embodiments, the type of window including element and sub element, e.g., screw, sizes, shapes, materials, and other attributes may be supplied to system 10 via user entry or data received by software system 100.

Door G may include elements such as a door $g_1$ door frame $g_2$ and other elements $g_n$ that makes up the door. In some exemplary embodiments, the type of door including elements and sub element, e.g., screw, sizes, shapes, materials, and other attributes may be supplied to system 10 via user entry or data received by software system 100.

Rigid insulation H may include elements such as foamboard $h_1$ and other sub elements $h_n$, that makes up the rigid insulation. In some exemplary embodiments, the type of rigid insulation including element sizes, shapes, materials, and other attributes may be supplied to system 10 via user entry or data received by software system 100.

Strapping I may include elements such as a woodstrip $i_1$ and other elements $i_n$ that make up the strapping. In some exemplary embodiments, the type of strapping including elements and sub element, e.g., nail, sizes, shapes, materials, and other attributes may be supplied to system 10 via user entry or data received by software system 100.

Plumbing J may include elements such as a pipes $j_1$ and other elements $j_n$ that makes up the plumbing. In some exemplary embodiments, the type of plumbing including elements and sub element, e.g., coupling connector, sizes, shapes, materials, and other attributes may be supplied to system 10 via user entry or data received by software system 100.

Electrical wiring K may include elements such as a conduit $k_1$ and other sub elements $k_n$ that makes up the electrical wiring. In some exemplary embodiments, the type of electrical wiring including elements and sub element, e.g., wire, sizes, shapes, materials, and other attributes may be supplied to system 10 via user entry or data received by software system 100.

Figure 12:
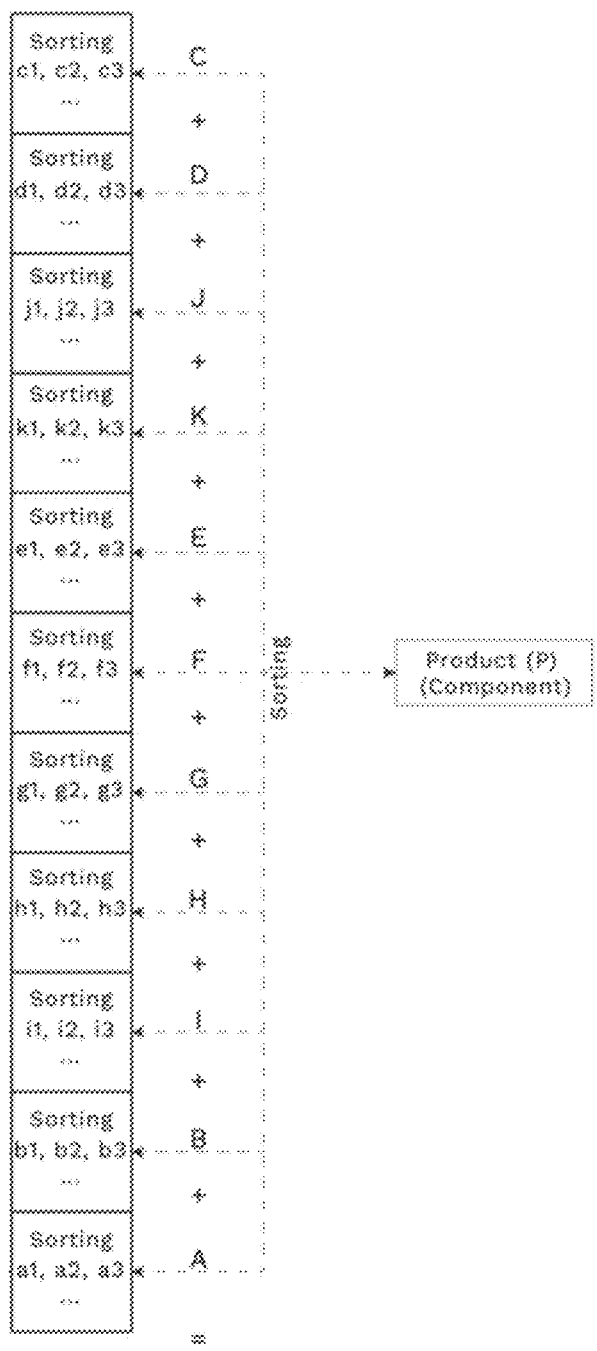
FIG. 12 shows a schematic representation of the sorting of the components based on the BIM of FIG. 11 in accordance with exemplary embodiments hereof.

FIG. 12 shows a schematic representation of the sorting of the components A (a1, a2, a3, etc.), B (b1, b2, b3, etc.), C (c1, c2, c3, etc.), D (d1, d2, d3, etc.), E (e1, e2, e3, etc.), F (f1, f2, f3, etc.), G (g1, g2, g3, etc.), H (h1, h2, h3, etc.), I (i1, i2, i3, etc.), J (j1, j2, j3, etc.), and K (k1, k2, k3, etc.) for a product P.

Turning now to the next figure, FIG. 12A shows a schematic flowchart of a method performed by a mass customizable production system in accordance with exemplary embodiments of the present invention. More specifically, method 1200 is illustrated. Although method 1200 is shown in a particular sequence of steps for illustrative purposes, a person of ordinary skill in the art will appreciate that some of these steps may and additional or less steps, may be performed in a similar or alternative sequence without deviating from the scope of the present invention.

In step 1201, software system 100 receives an information model associated with a product 1210 such as a building or building component. In some exemplary embodiments, the information model may be received from a third party or from some other aspect of system 10. For example, and without limiting the scope of the present invention, in some embodiments, the information model is generated at least in part by design module 102.

In step 1202, software system 100 generates a production matrix including parametric data of one or more items 1211 and 1212 required to build the product 1210 based at least in part on the information model. The parametric data typically includes parameters of the various elements of each item, such as items 1211 and 1212. The parameters may include parameters such as reference points for each element, for example a center point of an element; the parameters may include edge conditions of an element—whether the element has curves, straight edges, etc.; the parameters may include material information about the element, such as whether the element comprises of wood, or even the type of wood, the condition of the wood, etc.; or the parameters may include any other information that facilitates production of product P including facilitation of handling elements and sub elements necessary to build product P.

To retrieve as much information about product P, and to facilitate allocation of work and tools to fabricate product P and any component or element used to build product P, this step may include decomposing the product. For example, and without limiting the scope of the present invention, step 1202 may include decomposing a product 1210, such as a building, into several products required to build the building, such as floors 1211 and walls 1212, based on the information model associated with building 1210. In this step, software system 100 may sort the components of the floors 1211 in a manner much like the sorting of the components in reference to FIG. 12, in which each of the components is sorted with their respective elements and sub elements. Similarly, in this step, software system 100 may similarly sort the components, elements, and sub elements of the walls 1212.

In exemplary embodiments, parametric data of the floors 1211 and walls 1212 required to build building 1210 includes the geometry of each of the elements and sub elements or sets of elements and sub elements required to build the floors 1211 and walls 1212. For example, the geometry of a gypsum board, the geometry of nails, screws, plates, headers, rafters, girders, etc. Similarly, parametric data of the floors 1211 and walls 1212 may include a center point or reference point of a gypsum board, a plate, headers, rafters, girders, etc. Similarly, parametric data of the floors 1211 and walls 1212 may include an edge condition of a gypsum board, a plate, headers, rafters, girders, etc. This information may be used by software system 100 to facilitate control of the robotic units 206 when handling the elements during the construction or fabrication process.

In step 1203, software system 100 may sort a plurality of the production cells in a sequence suitable for creating the product 1210 based at least in part on the production matrix generated in step 1202. This step may include selectively assigning to one or more cells (see FIG. 4, for example) of a plurality of production cells (see FIG. 8, for example) (i) work to be performed to form the product or component thereof (for example one of the walls 1212) and one or more tools to perform the work. As mentioned above, each production cell of the plurality of production cells may be configurable with at least one robotic unit adapted to use one or more tools to form an item such as one or more components of wall 1212, associated with the product 1210. In exemplary embodiments, the step of assigning the work to be performed to form the product is achieved by engineering module 104.

As discussed further below, the work to be performed to form the item may include any type of work that is necessary in the fabrication process, including, but not limited to, sorting, processing, assembling, painting, or any other type of function that may be necessary or useful in the fabrication process. Similarly, a variety of tools may be implemented without deviating from the scope of the present invention, including as mentioned above, tools pertaining to at least one of material handling, milling, cutting, fastening, and or spraying.

In step 1204, software system 100 may control the one or more robotic units 204 used by the plurality of production cells based at least in part on the parametric data of the one or more items to build the product 1210. Although in this example wall 1212 is illustrated, the product may include exterior walls, interior walls, floors, ceilings, structural elements, casework kits, bathroom kits, vertical connections, building accessories, or any other type of product suitable for fabrication using system 10.

Figure 12B:
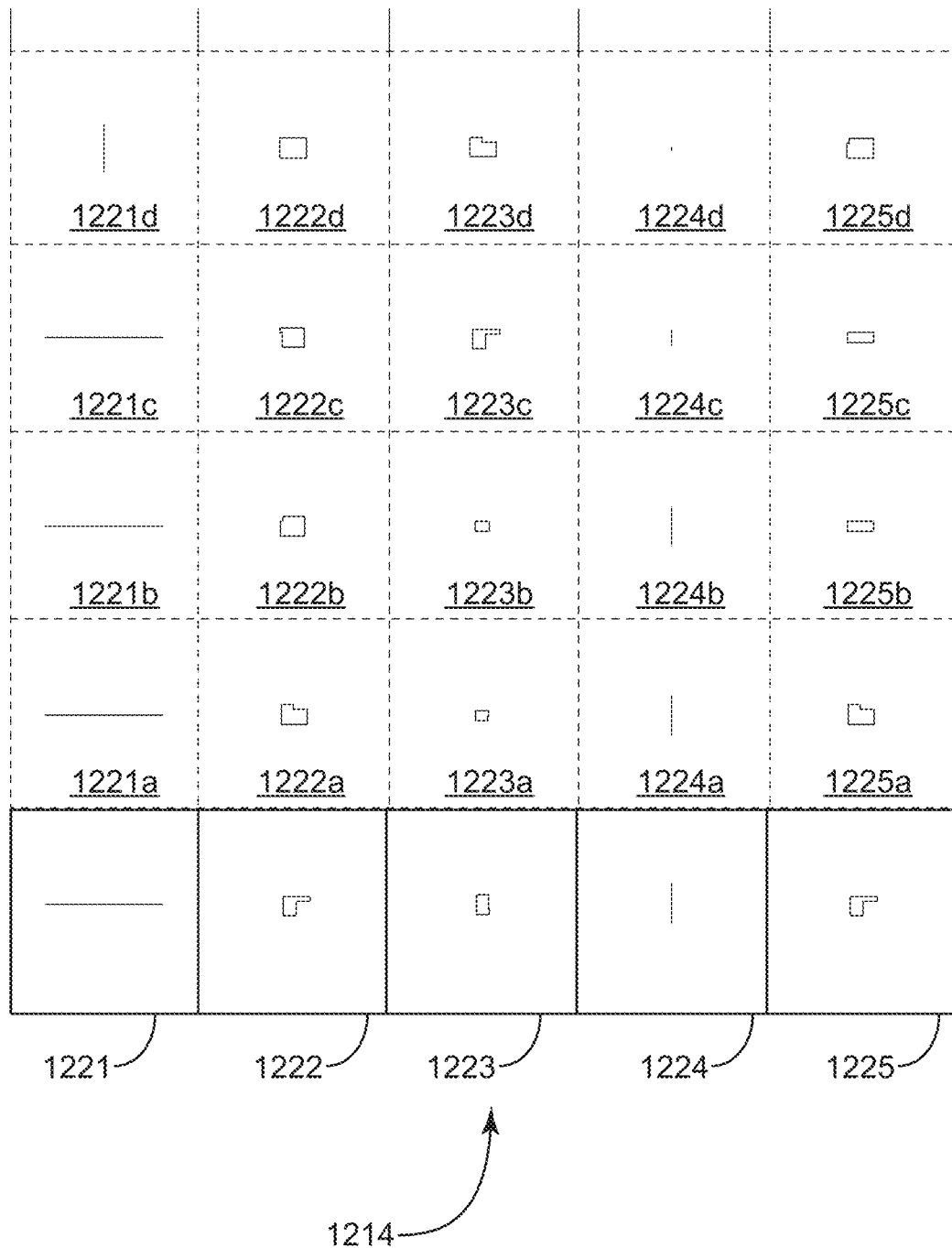
FIG. 12B shows a schematic representation of the production matrix for one of the components used to create the product discussed with reference to FIG. 12A, in accordance with exemplary embodiments hereof.

FIG. 12B shows a schematic representation of the production matrix for one of the elements used to create the product discussed with reference to FIG. 12A. More specifically, this view shows a schematic representation of a production matrix 1214 for wall 1212. In this view, it may be appreciated that a production matrix generated by system 10 typically includes the components and elements of an item, in this case of wall 1212. System 10, or rather software system 100 of system 10, utilizes the production matrix to assign the work and tools to one or more of the production cells.

In this case, by way of illustrating an example and without limiting the scope of the present invention, software system 100 breaks down or decomposes each of the components and elements of wall 1212 to account for the same when assigning the work to be performed on a particular item and the tools to be used for performing the work. Here, the elements illustratively include frame component 1221 and its elements 1221a, 1221b, 1221c, and 1221d; sheath component 1222 and its elements 1222a, 1222b, 1222c, and 1222d; insulation component 1223 and its elements 1223a, 1223b, 1223c, and 1223d; strap component 1224 and its elements 1224a, 1224b, 1224c, and 1224d; and drywall component 1225 and its elements 1225a, 1225b, 1225c, and 1225d. System 10 may receive this information from the information model associated with the product to be produced—in this example product 1210—and in addition, some of the information may be received from user input, such as input received from receipt of materials, including the wood, metals, and other components received for the fabrication process.

Figure 12C:
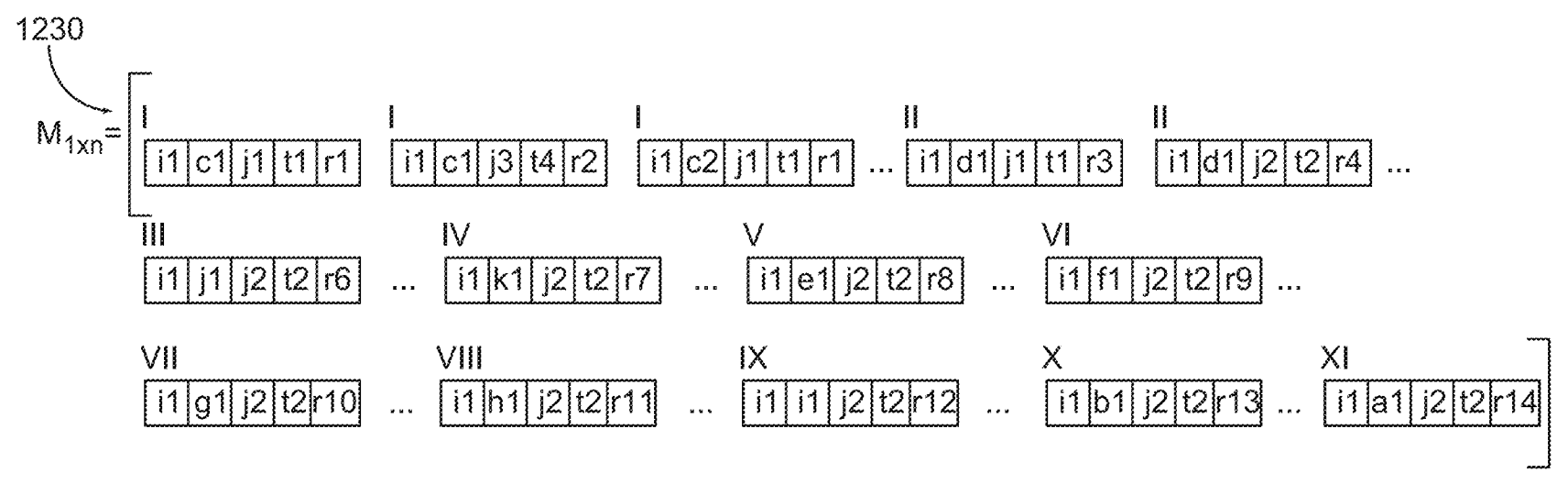

Turning now to the next set of figures, FIG. 12C-FIG. 12E show exemplary data structures that may be used by a software system in accordance with the present invention. More specifically, FIG. 12C illustrates an exemplary matrix decomposition of a production matrix for an item such as a wall; FIG. 12D is an exemplary factor of the production matrix 1230 shown in the matrix decomposition of FIG. 12C; and FIG. 12E includes a set of definitions for work 1233 to be performed on the items indicated in the production matrix 1230, and a set of definitions for tools 1235 to be used to perform the work on the items indicated in the production matrix 1230.

For example, and without limiting the scope of the present invention, production matrix 1230 may comprise a product of the various assignments of work and tools to the various production cells for the various items that may be fabricated during a production sequence for a particular product. With reference to FIG. 12D, a single row array may be used to indicate that: an item (i) 1231 (for example a wall) will be worked on in a particular production cell VIII (such as the production cell illustrated in FIG. 4), the work will be performed specifically on the component (c) 1232 of the item (i) (such as the insulation of the wall), the tools (t) 1235 to be used to perform the work, and the robotic unit (r) 1234 assigned to the production cell VIII to work on item 1231. In this case, using FIG. 12E as the exemplary set of definitions for work 1233 to be performed on the items indicated in the production matrix 1230 and the set of definitions for tools 1235 to be used to perform the work on the items indicated in the production matrix 1230, indicate that software system 100 has assigned production cell VIII to work on the insulation of a wall, performing a task 1235 (e.g., sorting, assembling, fabricating) using tools 1236 (e.g., handling) of a robotic unit.

FIG. 12F shows a schematic representation of a production matrix 1237 in accordance with the present invention. More specifically, a linear graphical model of a matrix productions is shown in this view, in which production cells I-XI have been assigned to work on items in a linear configuration. However, as will be shown in the next several exemplary views, a single production cell and/or various linear and non-linear series of production cells may be employed to maximize use of space in a facility, and efficient use of available resources of the production cells of system 10.

Figure 12G:
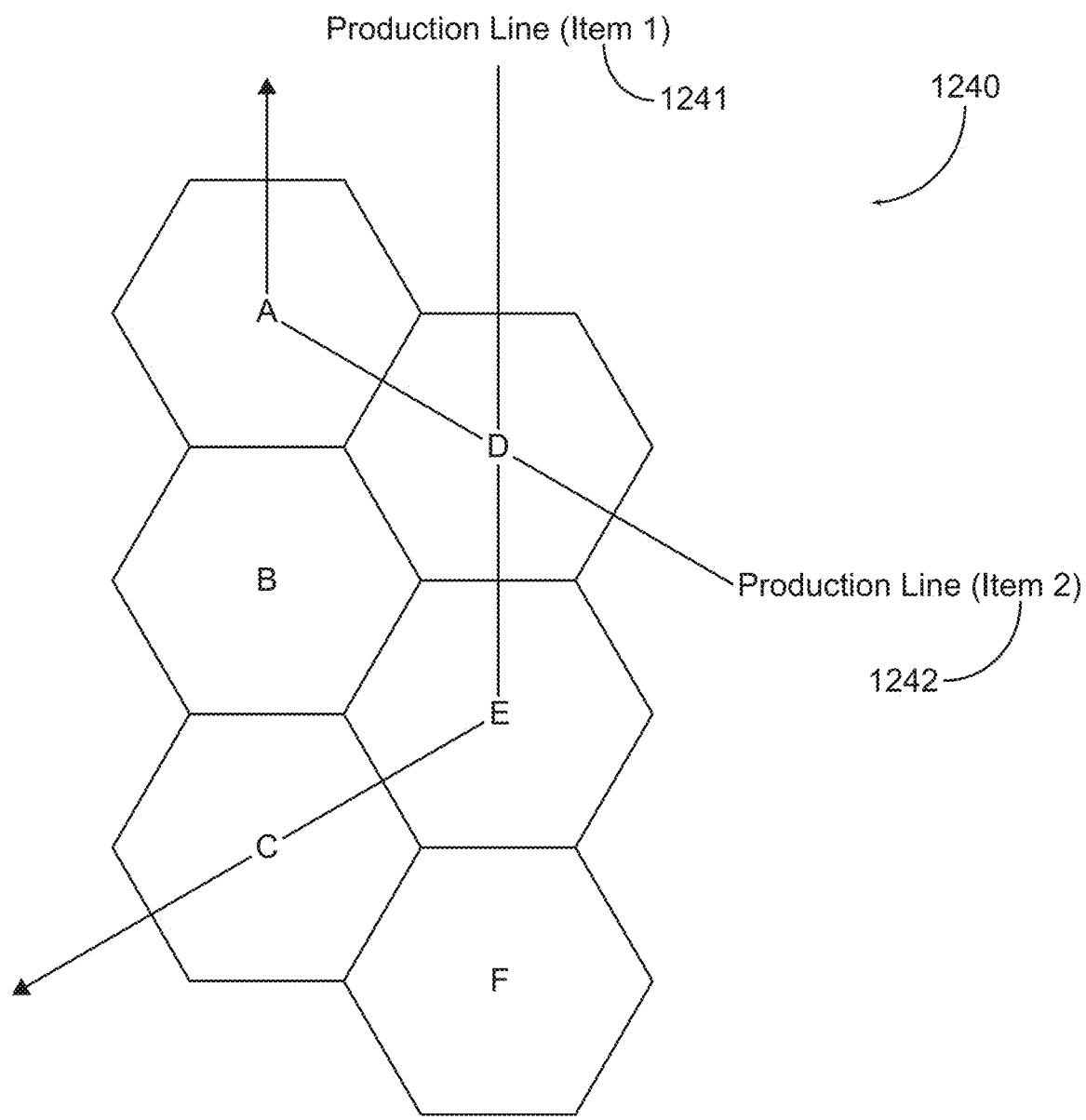
FIG. 12G shows a schematic representation of a plurality of productions cells in accordance with one exemplary embodiment of the present invention.

Turning first to FIG. 12G, a portion of a plurality of production cells shows a schematic representation of exemplary production lines 1241 and 1242 that utilize non-linear paths D-E-C, and D-A, respectively, to create items 1 and 2, respectively. In an exemplary embodiment, for example, software system 100 may assign work to be performed to form item 1, and the tools to perform the work to form item 1 to production cell D, then, assign additional work to be performed to form item 1, and the tools to perform the additional work to form item 1 to production cell E, and then similarly make the assignment to production cell C until production of item 1 is completed. Simultaneously, subsequently, or previously, software system 100 can also assign work to be performed to form item 2, and the tools to perform the work to form item 2 to production cell D and then similarly make the assignment to production cell A to create item 2. Notably, a product may be build using a single production cell, which may or may not be reconfigured; that is, a single production cell may be reconfigured with different robotic units and used continuously after reconfiguration. Moreover, and as will be illustrated with reference to the following figure, the sequence of production cells suitable for building an item or product may comprises of a single production cell, a group of production cells that are selected out of sequence, or a group of production cells that are selected in sequential order, such that a so-called "production line" of one or more production cells assigned to build a particular product may comprise of a linear or non-linear production line.

Figure 12H:
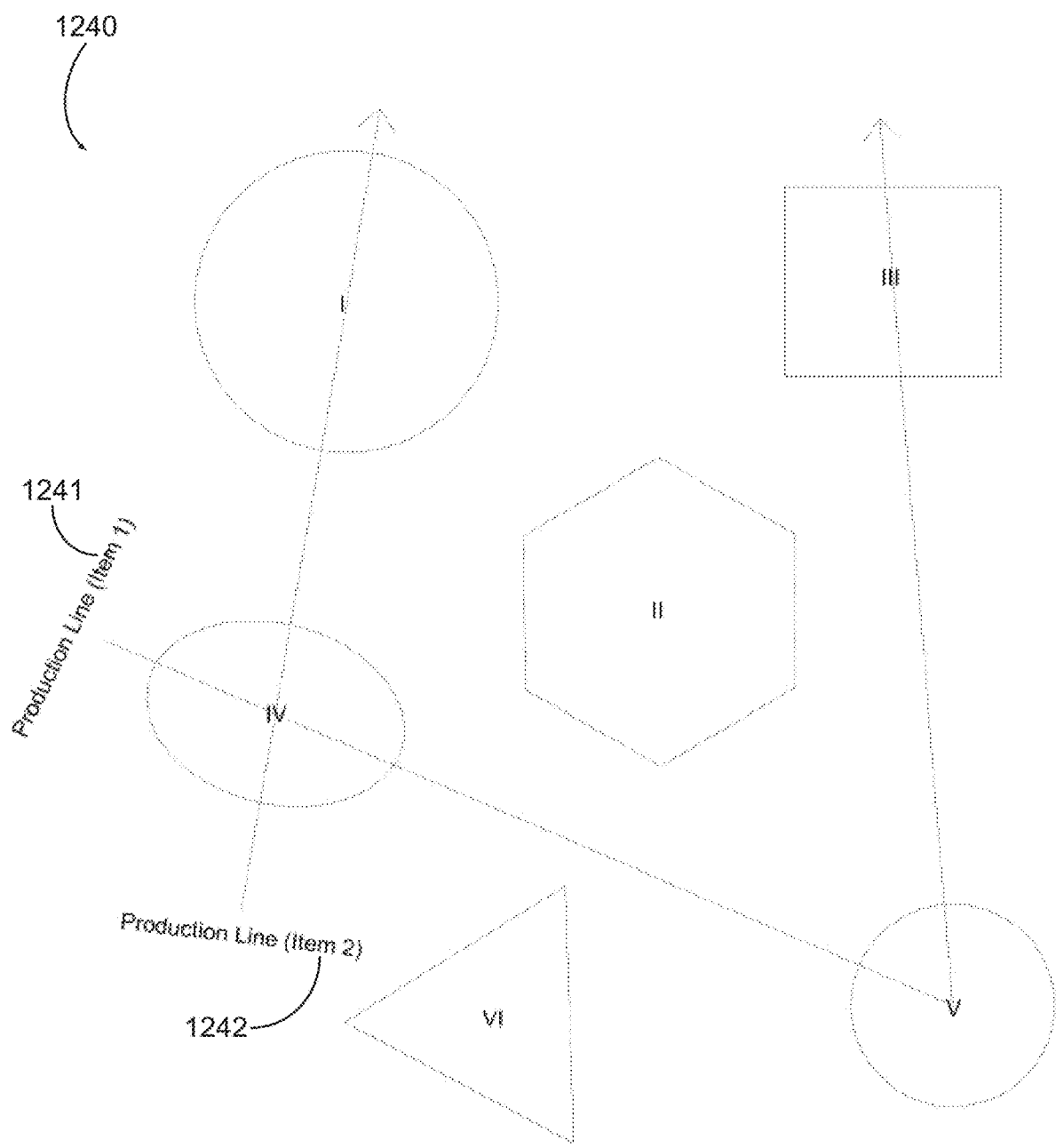
FIG. 12H shows a schematic representation of a plurality of productions cells in accordance with one exemplary embodiment of the present invention.

Turning next to FIG. 12H another embodiment is shown in which the production cells are not necessarily organized in a linear manner, for example in rows and columns, but rather spread out to make use of a space within a facility. In this exemplary embodiment, each of the plurality of production cells 1240 are spatially spread throughout a facility, each production cell represented by a different shape—such as a square, hexagon, triangle, circle, or eclipse—to illustrate that each production cell may be configured and reconfigured to have different spatial qualities depending on the robotic units and or tools assigned to the production cell for a particular project. In the exemplary illustrated embodiment, the production cells I-VI may have been sequentially or simultaneously assigned to multiple production lines (i.e., for production of item 1 and production of item 2). In the shown embodiment, production line 1241 to produce item 1 may employ production cells IV then V then III; while production line 1242 to produce item 2 may employ production cells IV then I. In some exemplary embodiments, a production cell may be used for multiple steps of the production process and may be reconfigured with different tools before each step. In this way, the present system is more efficient and in contrast to rigid production lines that sit idle when the work within each line is completed. By being able to assign different production cells taking up different spaces in a facility to the production of one or more products, the facility space may be better used; in combination to the reconfigurability of each production cell with various robotic units and or tools to perform an assigned task, the facility is configurable to mass produce highly customizable products and make highly efficient use of each production cell.

Figure 13:
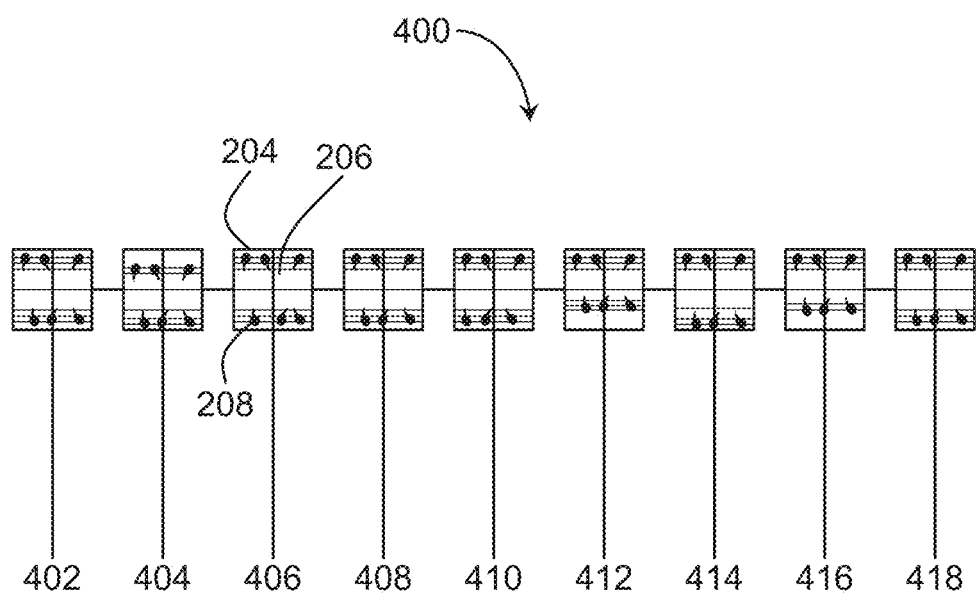
FIG. 13 shows aspects of production cells in accordance with exemplary embodiments hereof.

Taking the production of the walls as a specific example as shown in FIG. 13, a series of product-neutral cells 204 and associated product-neutral robotic production units 206 may be assigned and configured (e.g., with specific tooling 208) to perform the following work 400 in a single cell or as the walls move from one cell 204 to the next.

402: Framing processing/assembly;
404: Mechanical processing/assembly;
406: Electrical processing/assembly;
408: Plumbing processing/assembly;
410: Metal reinforcements assembly;
412: Windows and doors assembly;
414: Barriers assembly;
416: Finishing boards processing/assembly; and
418: Fixtures assembly.

It is understood that the actions 400 described above are meant for demonstration and that other actions may be taken in addition to those listed. It also is understood that not all of the actions need be taken. It also is understood that the scope of the system 10 is not limited in any way by the actions described herein or otherwise that it may take while performing its functionalities.

Accordingly, in some exemplary embodiments, system 10 may include plurality of production cells 204, each production cell configurable with at least one robotic unit 206 adapted to use one or more tools 208 to form an element associated with a product P for a prefabricated home. System 10 further includes software system 100, which is in communication with one or more robotic units 206 used by the plurality of production cells 204.

The software system 100 typically includes executable instructions within one or more dedicated modules configured for a variety of tasks, including but not limited to generating information models, analyzing information models, modifying information models, determining work to be performed by one or more production cells of the plurality of production cells 204, determining one or more tools to perform the work, selectively assigning to one or more production cells of the plurality of production cells work to be performed, selectively assigning to one or more production cells of the plurality of production cells one or more tools to perform the work, and or sorting (i.e., arrange systematically in groups) a plurality of cells in a sequence suitable for creating a product for a prefabricated home based on an information model.

In exemplary embodiments, software system 100 is configured to—based on an information model associated with a product—selectively assign to one or more cells of the matrix production cells 204 work to be performed to form the element, and one or more tools to perform the work, wherein the plurality of production cells 204 is defined by the software system 100 as a number of columns, each column representing the element to be worked on, and a number of rows, each row representing a type of work to be performed on the element. Moreover, software system 100 is further configured to sort a plurality of cells in a sequence suitable for creating the product for the prefabricated home based on the information model.

In some exemplary embodiments, the sequence of cells suitable for creating the product for the prefabricated home comprises of a group of production cells that are selected out of sequence—see for example FIG. 12. In some exemplary embodiments, the sequence of cells suitable for creating the product for the prefabricated home comprises of a group of production cells that are selected in sequential order—see for example, FIG. 11.

The assignment of work and tools to a particular cell for a particular component and element or sets of component and element used to create a product, and further the sorting—or systematic arrangement or assignment of work to a single or group of production cells—facilitates a mass customizable production line; this means that products that are highly customizable, may be none the less mass produced due to the highly customizable selection of tools and work flow that system 10 is able to achieve by way of software system 100's interaction with the plurality of production cells 204. In this way, even prefabricated homes may that are highly customizable may be mass produced.

To facilitate automation, software system 100 is configured to communicate with one of the production cells 204 by way of communicating with one or more components thereof. For example, and without limiting the scope of the present invention, software system 100 may communicate with one or more robotic units 206. As such, software system 100 may be configured to control movement of a robotic unit to a production cell assigned to perform work on the element and or control a tool assigned to the robotic unit to perform the work to form an element or product.

Figure 14:
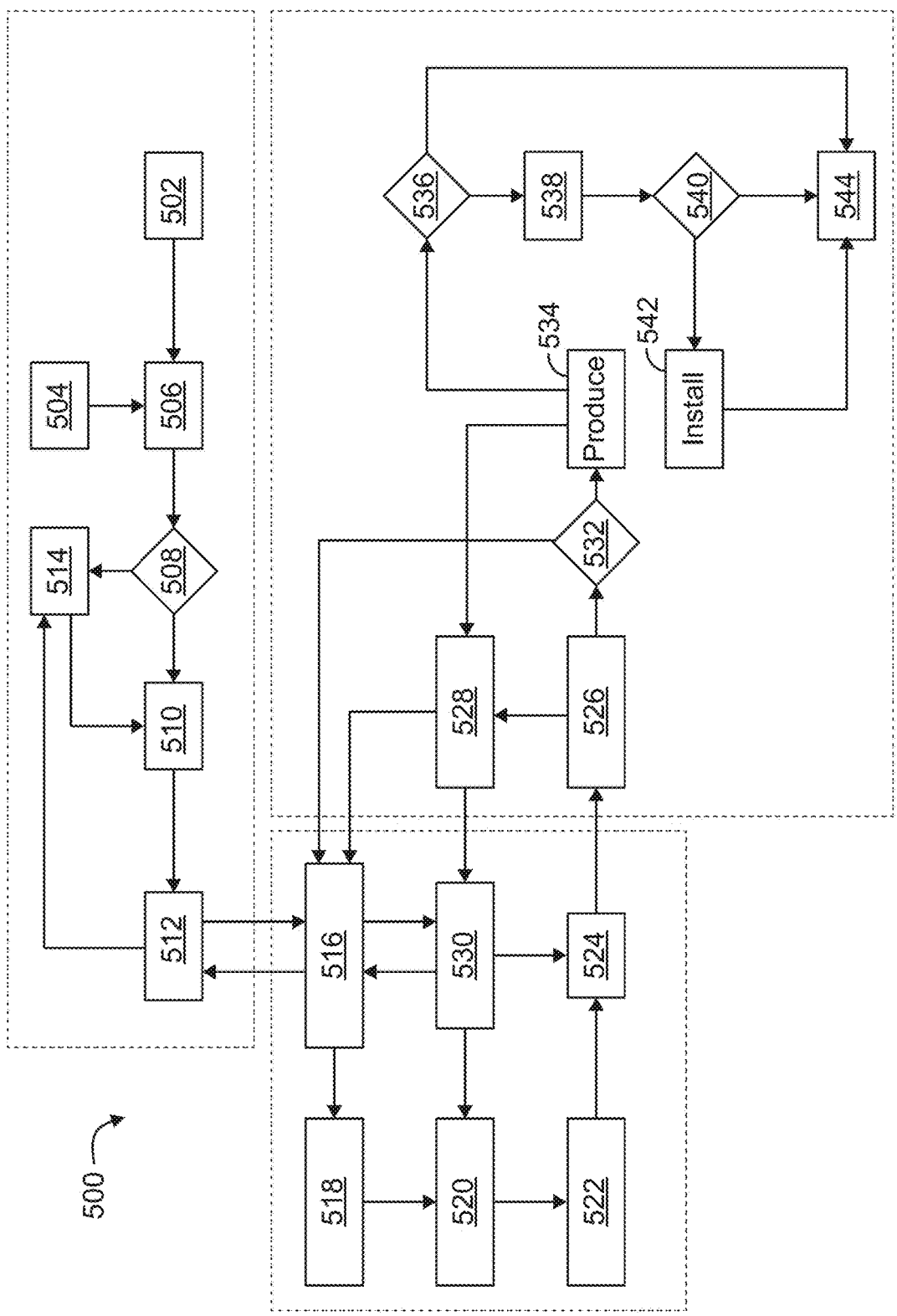
FIG. 14 shows an example workflow flowchart of a manufacturing facility in accordance with exemplary embodiments hereof.

FIG. 14 shows a workflow schematic for the system 10 and its use in producing one or more products P (e.g., prefabricated homes). In some embodiments, the following acts 500 may be performed by the system 10, with or without manual interaction from an operator(s). The process may begin at 502, a products list of available products to be produced may be provided (at 504), and a product may be selected (at 506). If a performant BIM is available at 508, the files may be uploaded (at 510) and the digital information may be provided to the Products Components Decomposition module at 512. If, however, a performant BIM is not available at 508, the digital information may be provided by the Products Components Decomposition module at 512, digitally modeled at 514, uploaded at 510 and provided back to the Products Components Decomposition module at 512.

At 516, the Products Components Decomposition module may provide the digital information (e.g., the BIM) to the Robotics Applications Tooling module, which may in turn, at 518, inform the Robotics Programming module. At 520, the Robotics Programming module may in turn inform the Robotics Function List. At 522, the Robotics Function List information may be passed to the Cell(s) 204 and run through a Simulator module at 526. The resulting simulation may be used to inform a Machine Learning module at 528 which may in turn provide learned information to a Products Elements Sorting module at 530. The Products Elements Sorting module may inform the Products Components Decomposition module, the Robotics Programming module, and/or the Cell(s) 204 with updated information accordingly.

At 532, if the resulting the simulation is accepted, the process may move into production of the product P at 534. If, however, the simulation is not accepted at 532, the simulation information may be sent to the Products Components Decomposition module for the process to repeat and for the information to be refined at 516. This process may continue until the resulting simulation is accepted at 532.

Once the product P is produced, if the product P is not to be delivered at 536, the process may end at 544. If, however, the product P is to be delivered at 536, the delivery may occur at 538. Then, if additional installation is required at 540, the installation may occur at 542, after which the process may end at 544.

It is understood that the workflow described above is meant for demonstration and that other actions not described by the system also may be performed, not all the actions may be performed, and/or the actions may be performed in other orders.

In some embodiments, the actions 502-512 may be implemented within a Design/Order Zone of the system 10, actions 516-524 may be implemented within an Engineering Zone of the system 10, and the actions 528-544 may be implemented within a Manufacturing/Delivery Zone of the system 10.

It is understood that any aspect and/or element of any of the embodiments described herein or otherwise may be combined in any way to form new embodiments easily understood by a person of ordinary skill in the art. Those of ordinary skill in the art will appreciate and understand, upon reading this description, that embodiments hereof may provide different and/or other advantages, and that not all embodiments or implementations need have all advantages.

Computing

The services, mechanisms, operations and acts shown and described above are implemented, at least in part, by software running on one or more computers or computer systems or devices. It should be appreciated that each user device is, or comprises, a computer system.

Programs that implement such methods (as well as other types of data) may be stored and transmitted using a variety of media (e.g., computer readable media) in a number of manners. Hard-wired circuitry or custom hardware may be used in place of, or in combination with, some or all of the software instructions that can implement the processes of various embodiments. Thus, various combinations of hardware and software may be used instead of software only.

One of ordinary skill in the art will readily appreciate and understand, upon reading this description, that the various processes described herein may be implemented by, e.g., appropriately programmed general purpose computers, special purpose computers and computing devices. One or more such computers or computing devices may be referred to as a computer system.

Figure 15:
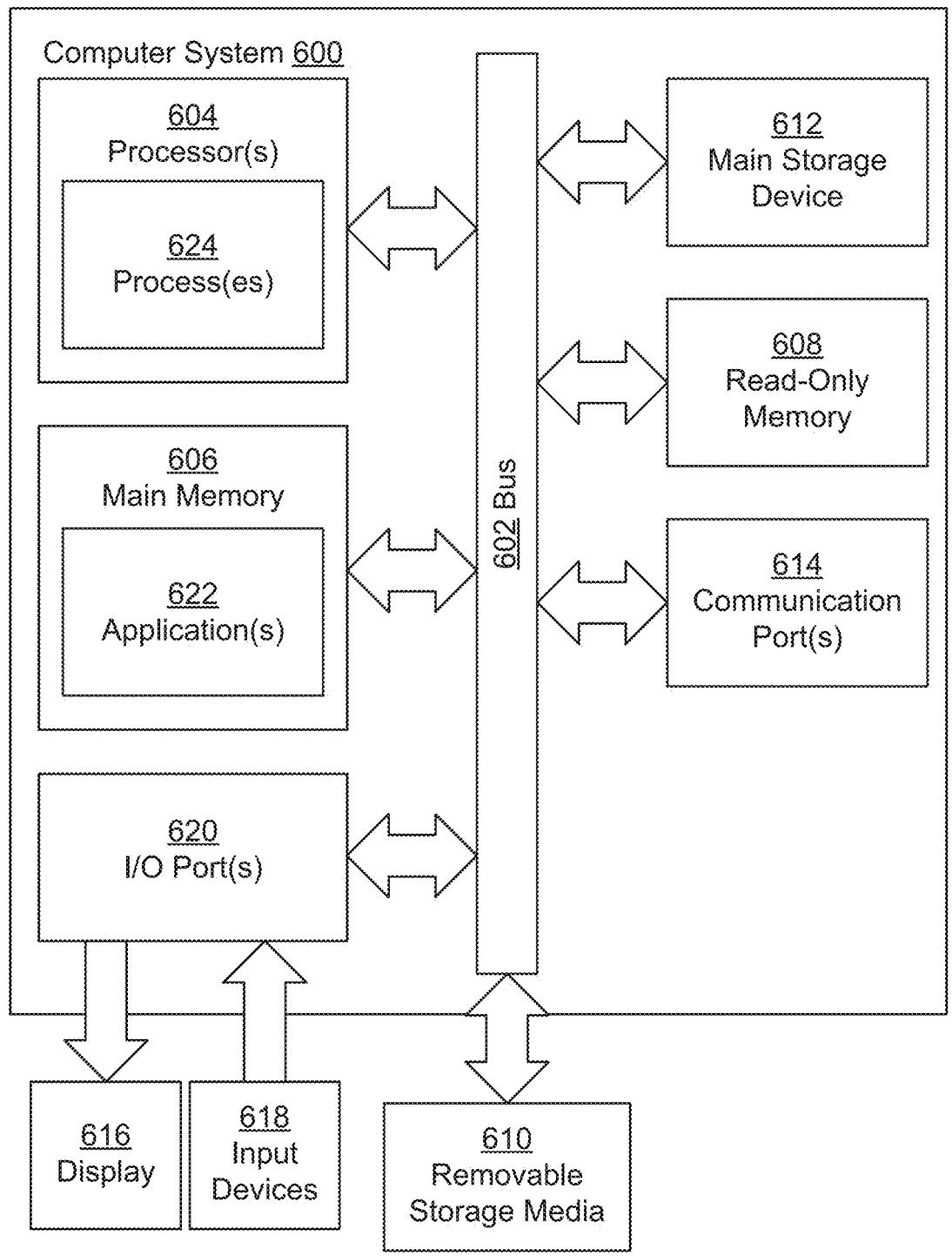
FIG. 15 depicts aspects of computing and computer devices in accordance with exemplary embodiments hereof.

FIG. 15 is a schematic diagram of a computer system 600 upon which embodiments of the present disclosure may be implemented and carried out.

According to the present example, the computer system 600 includes a bus 602 (i.e., interconnect), one or more processors 604, one or more communications ports 614, a main memory 606, removable storage media 610, read-only memory 608, and a mass storage 612. Communication port(s) 614 may be connected to one or more networks by way of which the computer system 600 may receive and/or transmit data.

As used herein, a "processor" means one or more microprocessors, central processing units (CPUs), computing devices, microcontrollers, digital signal processors, or like devices or any combination thereof, regardless of their architecture. An apparatus that performs a process can include, e.g., a processor and those devices such as input devices and output devices that are appropriate to perform the process.

Processor(s) 604 can be (or include) any known processor, such as, but not limited to, an Intel® Itanium® or Itanium 2® processor(s), AMD® Opteron® or Athlon MP® processor(s), or Motorola® lines of processors, and the like. Communications port(s) 614 can be any of an RS-232 port for use with a modem-based dial-up connection, a 10/100 Ethernet port, a Gigabit port using copper or fiber, or a USB port, and the like. Communications port(s) 614 may be chosen depending on a network such as a Local Area Network (LAN), a Wide Area Network (WAN), a CDN, or any network to which the computer system 600 connects. The computer system 600 may be in communication with peripheral devices (e.g., display screen 616, input device(s) 618) via Input/Output (I/O) port 620. Some or all of the peripheral devices may be integrated into the computer system 600, and the input device(s) 618 may be integrated into the display screen 610 (e.g., in the case of a touch screen).

Main memory 610 can be Random Access Memory (RAM), or any other dynamic storage device(s) commonly known in the art. Read-only memory 608 can be any static storage device(s) such as Programmable Read-Only Memory (PROM) chips for storing static information such as instructions for processor(s) 604. Mass storage 612 can be used to store information and instructions. For example, hard disks such as the Adaptec® family of Small Computer Serial Interface (SCSI) drives, an optical disc, an array of disks such as Redundant Array of Independent Disks (RAID), such as the Adaptec® family of RAID drives, or any other mass storage devices may be used.

Bus 602 communicatively couples processor(s) 604 with the other memory, storage and communications blocks. Bus 602 can be a PCI/PCI-X, SCSI, a Universal Serial Bus (USB) based system bus (or other) depending on the storage devices used, and the like. Removable storage media 610 can be any kind of external hard-drives, floppy drives, IOMEGA® Zip Drives, Compact Disc-Read Only Memory (CD-ROM), Compact Disc-Re-Writable (CD-RW), Digital Versatile Disk-Read Only Memory (DVD-ROM), etc.

Embodiments herein may be provided as one or more computer program products, which may include a machine-readable medium having stored thereon instructions, which may be used to program a computer (or other electronic devices) to perform a process. As used herein, the term "machine-readable medium" refers to any medium, a plurality of the same, or a combination of different media, which participate in providing data (e.g., instructions, data structures) which may be read by a computer, a processor, or a like device. Such a medium may take many forms, including but not limited to, non-volatile media, volatile media, and transmission media. Non-volatile media include, for example, optical or magnetic disks and other persistent memory. Volatile media include dynamic random access memory, which typically constitutes the main memory of the computer. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications.

The machine-readable medium may include, but is not limited to, floppy diskettes, optical discs, CD-ROMs, magneto-optical disks, ROMs, RAMs, erasable programmable read-only memories (EPROMs), electrically erasable programmable read-only memories (EEPROMs), magnetic or optical cards, flash memory, or other type of media/machine-readable medium suitable for storing electronic instructions. Moreover, embodiments herein may also be downloaded as a computer program product, wherein the program may be transferred from a remote computer to a requesting computer by way of data signals embodied in a carrier wave or other propagation medium via a communication link (e.g., modem or network connection).

Various forms of computer readable media may be involved in carrying data (e.g., sequences of instructions) to a processor. For example, data may be (i) delivered from RAM to a processor; (ii) carried over a wireless transmission medium; (iii) formatted and/or transmitted according to numerous formats, standards, or protocols; and/or (iv) encrypted in any of a variety of ways well known in the art.

A computer-readable medium can store (in any appropriate format) those program elements that are appropriate to perform the methods.

As shown, main memory 610 is encoded with application(s) 622 that support(s) the functionality as discussed herein (an application 622 may be an application that provides some or all of the functionality of one or more of the mechanisms described herein). Application(s) 622 (and/or other resources as described herein) can be embodied as software code such as data and/or logic instructions (e.g., code stored in the memory or on another computer readable medium such as a disk) that supports processing functionality according to different embodiments described herein.

During operation of one embodiment, processor(s) 604 accesses main memory 610 via the use of bus 602 in order to launch, run, execute, interpret or otherwise perform the logic instructions of the application(s) 622. Execution of application(s) 622 produces processing functionality of the service(s) or mechanism(s) related to the application(s). In other words, the process(es) 624 represents one or more portions of the application(s) 622 performing within or upon the processor(s) 604 in the computer system 600.

It should be noted that, in addition to the process(es) 624 that carries(carry) out operations as discussed herein, other embodiments herein include the application 622 itself (i.e., the un-executed or non-performing logic instructions and/or data). The application 622 may be stored on a computer readable medium (e.g., a repository) such as a disk or in an optical medium. According to other embodiments, the application 622 can also be stored in a memory type system such as in firmware, read only memory (ROM), or, as in this example, as executable code within the main memory 610 (e.g., within Random Access Memory or RAM). For example, application 622 may also be stored in removable storage media 610, read-only memory 608, and/or mass storage device 612.

Those of ordinary skill in the art will understand that the computer system 600 can include other processes and/or software and hardware components, such as an operating system that controls allocation and use of hardware resources.

As discussed herein, embodiments of the present invention include various steps or operations. A variety of these steps may be performed by hardware components or may be embodied in machine-executable instructions, which may be used to cause a general-purpose or special-purpose processor programmed with the instructions to perform the operations. Alternatively, the steps may be performed by a combination of hardware, software, and/or firmware. The term "module" refers to a self-contained functional component, which can include hardware, software, firmware, or any combination thereof.

One of ordinary skill in the art will readily appreciate and understand, upon reading this description, that embodiments of an apparatus may include a computer/computing device operable to perform some (but not necessarily all) of the described process.

Embodiments of a computer-readable medium storing a program or data structure include a computer-readable medium storing a program that, when executed, can cause a processor to perform some (but not necessarily all) of the described process.

Where a process is described herein, those of ordinary skill in the art will appreciate that the process may operate without any user intervention. In another embodiment, the process includes some human intervention (e.g., a step is performed by or with the assistance of a human).

As used in this description, the term "portion" means some or all. So, for example, "A portion of X" may include some of "X" or all of "X". In the context of a conversation, the term "portion" means some or all of the conversation.

As used herein, including in the claims, the phrase "at least some" means "one or more," and includes the case of only one. Thus, e.g., the phrase "at least some ABCs" means "one or more ABCs", and includes the case of only one ABC.

As used herein, including in the claims, the phrase "based on" means "based in part on" or "based, at least in part, on," and is not exclusive. Thus, e.g., the phrase "based on factor X" means "based in part on factor X" or "based, at least in part, on factor X." Unless specifically stated by use of the word "only", the phrase "based on X" does not mean "based only on X."

As used herein, including in the claims, the phrase "using" means "using at least," and is not exclusive. Thus, e.g., the phrase "using X" means "using at least X." Unless specifically stated by use of the word "only", the phrase "using X" does not mean "using only X."

In general, as used herein, including in the claims, unless the word "only" is specifically used in a phrase, it should not be read into that phrase.

As used herein, including in the claims, the phrase "distinct" means "at least partially distinct." Unless specifically stated, distinct does not mean fully distinct. Thus, e.g., the phrase, "X is distinct from Y" means that "X is at least partially distinct from Y," and does not mean that "X is fully distinct from Y." Thus, as used herein, including in the claims, the phrase "X is distinct from Y" means that X differs from Y in at least some way.

As used herein, including in the claims, a list may include only one item, and, unless otherwise stated, a list of multiple items need not be ordered in any particular manner. A list may include duplicate items. For example, as used herein, the phrase "a list of XYZs" may include one or more "XYZs".

It should be appreciated that the words "first" and "second" in the description and claims are used to distinguish or identify, and not to show a serial or numerical limitation. Similarly, the use of letter or numerical labels (such as "(a)", "(b)", and the like) are used to help distinguish and/or identify, and not to show any serial or numerical limitation or ordering.

No ordering is implied by any of the labeled boxes in any of the flow diagrams unless specifically shown and stated. When disconnected boxes are shown in a diagram the activities associated with those boxes may be performed in any order, including fully or partially in parallel.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An automated manufacturing system comprising:
   a matrix of production cells;
   a first production cell within the matrix of production cells and a second production cell within the matrix of production cells;
   a first robotic production unit adapted to move to the first production cell or to the second production cell;
   a second robotic production unit adapted to move to the first production cell or to the second production cell;
   a first tool configurable with the first robotic production unit and with the second robotic production unit;
   a second tool configurable with the first robotic production unit and with the second robotic production unit; and
   a software system configured to process an information model of a product, and based at least in part on the information model, to sort the first production cell and the second production cell in a sequence suitable for building the product, and to assign first work to be performed on the product in the first production cell by the first robotic production unit using the first tool and second work to be performed on the product in the second production cell by the second robotic production unit using the second tool.

2. The automated manufacturing system of claim 1 wherein the software system is further configured to control movement of the first production unit to the first production cell and/or the movement of the second production unit to the second production cell.

3. The automated manufacturing system of claim 1 wherein the software system is further configured to control the first tool to perform the first work within the first production cell, and/or to control the second tool to perform the second work within the second production cell.

4. The automated manufacturing system of claim 1 wherein the software system is further configured to control movement of the product from the first production cell to the second production cell.

5. The automated manufacturing system of claim 1 wherein the software system is further configured to control a first delivery of first raw materials to the first production cell and a second delivery of second raw materials to the second production cell.

6. The automated manufacturing system of claim 1 further comprising a first track leading to the first production cell and a second track leading to the second production cell, and wherein the first robotic production unit and the second robotic production unit are each configured to move to the first production cell along the first track and/or to the second production cell along the second track.

7. The automated manufacturing system of claim 6 wherein the first track and the second track are configured above the matrix of production cells and the first robotic production unit and the second robotic production unit are each suspended from the first track or from the second track.

8. The automated manufacturing system of claim 1 wherein the first work and/or the second work are performed on a prefabricated building product including at least one of exterior walls, interior walls, floors, ceilings, structural elements, casework kits, bathroom kits, vertical connections, and building accessories.

9. The automated manufacturing system of claim 1 wherein the first work and/or the second work include at least one of sorting, processing, assembling, and painting.

10. The automated manufacturing system of claim 1 wherein the first tool and/or the second tool include tools pertaining to at least one of material handling, milling, cutting, fastening, and spraying.

11. A method for automated manufacturing comprising:
   (A) providing a first production cell within a matrix of production cells and a second production cell within the matrix of production cells;
   (B) providing a first robotic production unit adapted to move to the first production cell or to the second production cell, and a second robotic production unit adapted to move to the first production cell or to the second production cell;
   (C) providing a first tool configurable with the first robotic production unit and with the second robotic production unit, and a second tool configurable with the first robotic production unit and with the second robotic production unit;
   (D) using a software system to process an information model of a product;
   (E) based at least in part on the information model processed in (D), using the software system to:
   (F) sort the first production cell and the second production cell in a sequence suitable for building the product;
   (G) assign first work to be performed in the first production cell by the first robotic production unit using the first tool; and
   (H) assign second work to be performed in the second production cell by the second robotic production unit using the second tool.

12. The method of claim 11 further comprising:
   (I) using the software system to control movement of the first production unit to the first production cell and/or the movement of the second production unit to the second production cell.

13. The method of claim 12 further comprising:
   (J) using the software system to control the first tool to perform the first work within the first production cell, and/or the second tool to perform the second work within the second production cell.

14. The method of claim 12 further comprising:

(J) using the software system to control the first tool to perform the first work within the first production cell;

(K) moving the product from the first production cell to the second production cell;

(L) using the software system to control the second tool to perform the second work within the second production cell.

15. The method of claim 13 wherein the first work and/or the second work are performed on a prefabricated building product including at least one of exterior walls, interior walls, floors, ceilings, structural elements, casework kits, bathroom kits, vertical connections, and building accessories.

16. The automated manufacturing system of claim 15 wherein the first work and/or the second work include at least one of sorting, processing, assembling, and painting.

17. The method of claim 13 wherein the first tool and/or the second tool include tools pertaining to at least one of material handling, milling, cutting, fastening, and spraying.

18. The method of claim 11 further comprising:

(I) using the software system to control a first delivery of first raw materials to the first production cell and a second delivery of second raw materials to the second production cell.

19. The method of claim 11 further comprising:

(I) providing a first track leading to the first production cell and a second track leading to the second production cell;

(J) configuring the first robotic production unit with the first track and the second robotic production unit with the second track;

(K) using the software system to control movement of the first production unit along the first track to the first production cell and/or the movement of the second production unit along the second track to the second production cell.

20. The method of claim 19 wherein the first track and the second track are configured above the matrix of production cells and the first robotic production unit is suspended from the first track and the second robotic production unit is suspended from the second track.

* * * * *